(12) United States Patent  
Kewley et al.

(10) Patent No.: US 8,609,489 B2
(45) Date of Patent: *Dec. 17, 2013

(54) METHODS OF FORMING MEMORY; AND METHODS OF FORMING VERTICAL STRUCTURES

(75) Inventors: David A. Kewley, Boise, ID (US); Brian Cleereman, Boise, ID (US); Stephen W. Russell, Boise, ID (US); Rex Stone, Albuquerque, NM (US); Anthony C. Krauth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 262 days.

This patent is subject to a terminal disclaimer.

(21) Appl. No.: 13/154,259

(22) Filed: Jun. 6, 2011

(65) Prior Publication Data

US 2011/0237081 A1    Sep. 29, 2011

Related U.S. Application Data

(63) Continuation of application No. 12/497,128, filed on Jul. 2, 2009, now Pat. No. 7,972,926.

(51) Int. Cl.
*H01L 21/336* (2006.01)

(52) U.S. Cl.
USPC ............ 438/264; 438/313; 257/E21.038; 257/E21.023; 257/E21.024; 257/206; 257/E21.027

(58) Field of Classification Search
USPC ........ 257/E21.023, 24, 26, 27, 206, E21.038; 438/947, 948, 264, 313
See application file for complete search history.

(56) References Cited

U.S. PATENT DOCUMENTS

| | | | |
|---|---|---|---|
| 6,110,837 A * | 8/2000 | Linliu et al. | 438/723 |
| 6,395,613 B1 | 5/2002 | Juengling | |
| 6,656,844 B1 | 12/2003 | Lin et al. | |
| 7,291,560 B2 | 11/2007 | Parascandola et al. | |
| 7,790,360 B2 | 9/2010 | Alapati et al. | |
| 2003/0157436 A1 | 8/2003 | Manger et al. | |
| 2006/0046484 A1 | 3/2006 | Abatchev et al. | |
| 2006/0115978 A1 | 6/2006 | Specht et al. | |
| 2006/0211260 A1 | 9/2006 | Tran et al. | |
| 2006/0273456 A1 | 12/2006 | Sant et al. | |
| 2007/0210449 A1 | 9/2007 | Caspary et al. | |
| 2007/0238053 A1 | 10/2007 | Hashimoto | |
| 2007/0238308 A1 | 10/2007 | Niroomand et al. | |
| 2008/0169496 A1 | 7/2008 | Keller et al. | |
| 2008/0220600 A1 * | 9/2008 | Alapati et al. | 438/584 |
| 2009/0233238 A1 | 9/2009 | Hsu et al. | |
| 2010/0216307 A1 | 8/2010 | Niroomand et al. | |
| 2010/0264468 A1 | 10/2010 | Xu | |

* cited by examiner

*Primary Examiner* — N Drew Richards
*Assistant Examiner* — Ratisha Mehta
(74) *Attorney, Agent, or Firm* — Wells St. John P.S.

(57) ABSTRACT

Some embodiments include methods of forming memory. A series of photoresist features may be formed over a gate stack, and a placeholder may be formed at an end of said series. The placeholder may be spaced from the end of said series by a gap. A layer may be formed over and between the photoresist features, over the placeholder, and within said gap. The layer may be anisotropically etched into a plurality of first vertical structures along edges of the photoresist features, and into a second vertical structure along an edge of the placeholder. A mask may be formed over the second vertical structure. Subsequently, the first vertical structures may be used to pattern string gates while the mask is used to pattern a select gate. Some embodiments include methods of forming conductive runners, and some embodiments may include semiconductor constructions.

12 Claims, 21 Drawing Sheets

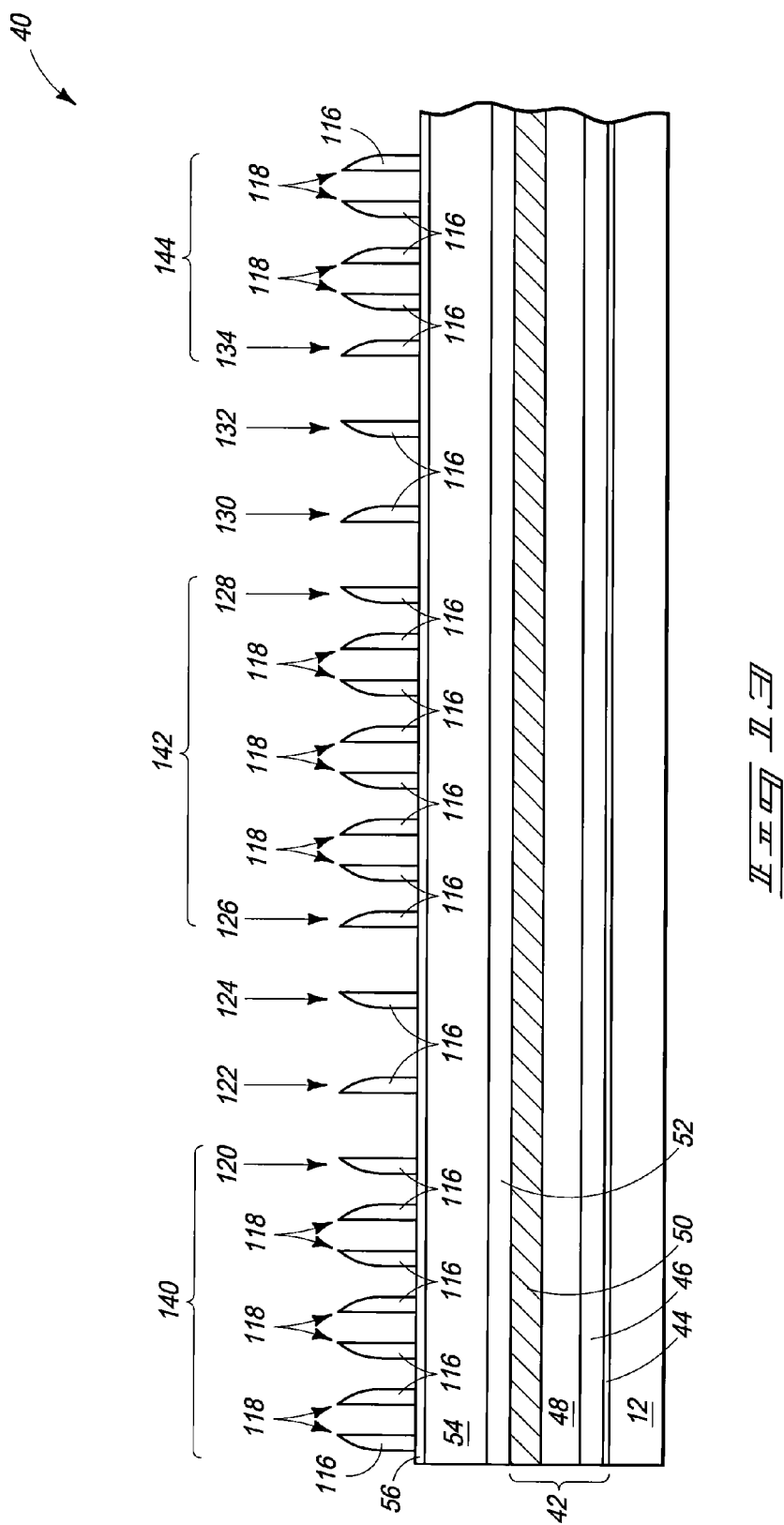

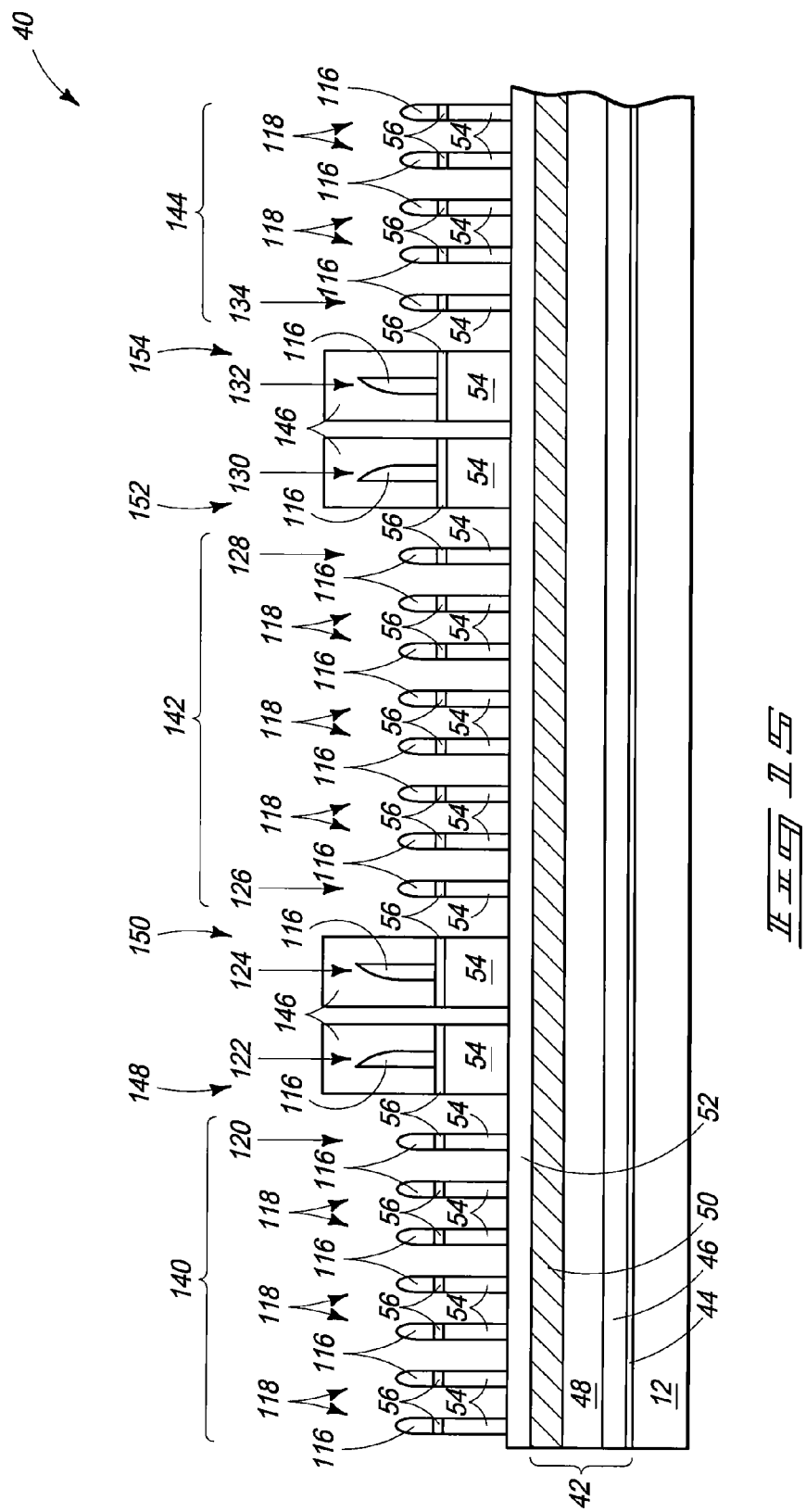

US 8,609,489 B2

1

METHODS OF FORMING MEMORY; AND METHODS OF FORMING VERTICAL STRUCTURES

RELATED PATENT DATA

This patent resulted from a continuation of U.S. patent application Ser. No. 12/497,128, which was filed Jul. 2, 2009, which issued as U.S. Pat. No. 7,972,926, and which is hereby incorporated herein by reference.

TECHNICAL FIELD

Methods of forming memory cells; and methods of forming and utilizing vertical structures.

BACKGROUND

Fabrication of integrated circuitry (IC) often involves formation of photolithographically-patterned photoresist over a semiconductor substrate. The patterned photoresist may then be utilized as a mask during subsequent patterning of the underlying substrate, and/or during implant of dopant into the underlying substrate. Alternatively, sidewall spacers may be formed along edges of the patterned photoresist, and the photoresist may then be removed to leave the sidewall spacers as a mask which may be utilized during subsequent patterning of the underlying substrate and/or during implant of dopant into the underlying substrate. An advantage of utilizing the sidewall spacers as the mask is that the sidewall spacers may be formed at a pitch which is about half the starting pitch of the patterned photoresist.

In many applications, it is desired that photolithographically-patterned photoresist form features having vertical sidewall edges. A difficulty that may be encountered during utilization of photolithographically-patterned photoresist is that the photoresist features may have sidewall edges that are not as vertical as desired.

FIG. 1 shows a prior art semiconductor construction 10 having photolithographically-patterned photoresist 14 over a semiconductor substrate 12.

Substrate 12 may comprise, consist essentially of, or consist of, for example, monocrystalline silicon lightly-doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above.

Photoresist 14 is patterned into three features 16, 18 and 20, with such features being spaced apart from one another by intervening gaps 22 and 24. The features 16 and 18 are about the same width as one another, while the feature 20 is much wider than features 16 and 18.

Feature 16 has sidewall edges 11 and 13, feature 18 has sidewall edges 15 and 17, and feature 20 has a sidewall edge 19. The sidewall edges 11, 13, 15 and 17 are substantially vertical, while the sidewall edge 19 is not vertical.

Referring to FIG. 2, a layer 26 is formed over features 16, 18 and 20, as well as within the gaps between such features.

Referring to FIG. 3, layer 26 is subjected to an anisotropic etch which converts the layer into a plurality of structures 28, 30, 32, 34 and 36. The structures 28, 30, 32 and 34 are

2 substantially the same as one another in configuration, but the structure 36 is different than features 28, 30, 32 and 34 due to edge 19 being non-vertical.

Referring to FIG. 4, photoresist 14 (FIG. 3) is removed to leave structures 28, 30, 32, 34 and 36 over substrate 12. Ideally, structures 28, 30, 32, 34 and 36 would be a repeating pattern of substantially identical structures corresponding to the desired pattern shown in FIG. 5. However, structure 36 of FIG. 4 does not have the appropriate shape to fall within the desired repeating pattern. This can detrimentally affect subsequent processing. For instance, if structures 28, 30, 32, 34 and 36 are to be used for patterning underlying substrate 12 into a plurality of substantially identical repeating elements, the inconsistent shape of structure 36 relative to the other structures may lead to formation of an element which is defective for its intended purpose.

It would be desirable to develop improved methods for formation of photolithographically-patterned photoresist which alleviate, or prevent, the prior art problems discussed above with reference to FIGS. 1-4.

BRIEF DESCRIPTION OF THE DRAWINGS

FIGS. 10-16 are diagrammatic, cross-sectional views of a portion of a semiconductor construction at various stages of an example embodiment method of forming NAND memory.

DETAILED DESCRIPTION OF THE ILLUSTRATED EMBODIMENTS

Figure 6:
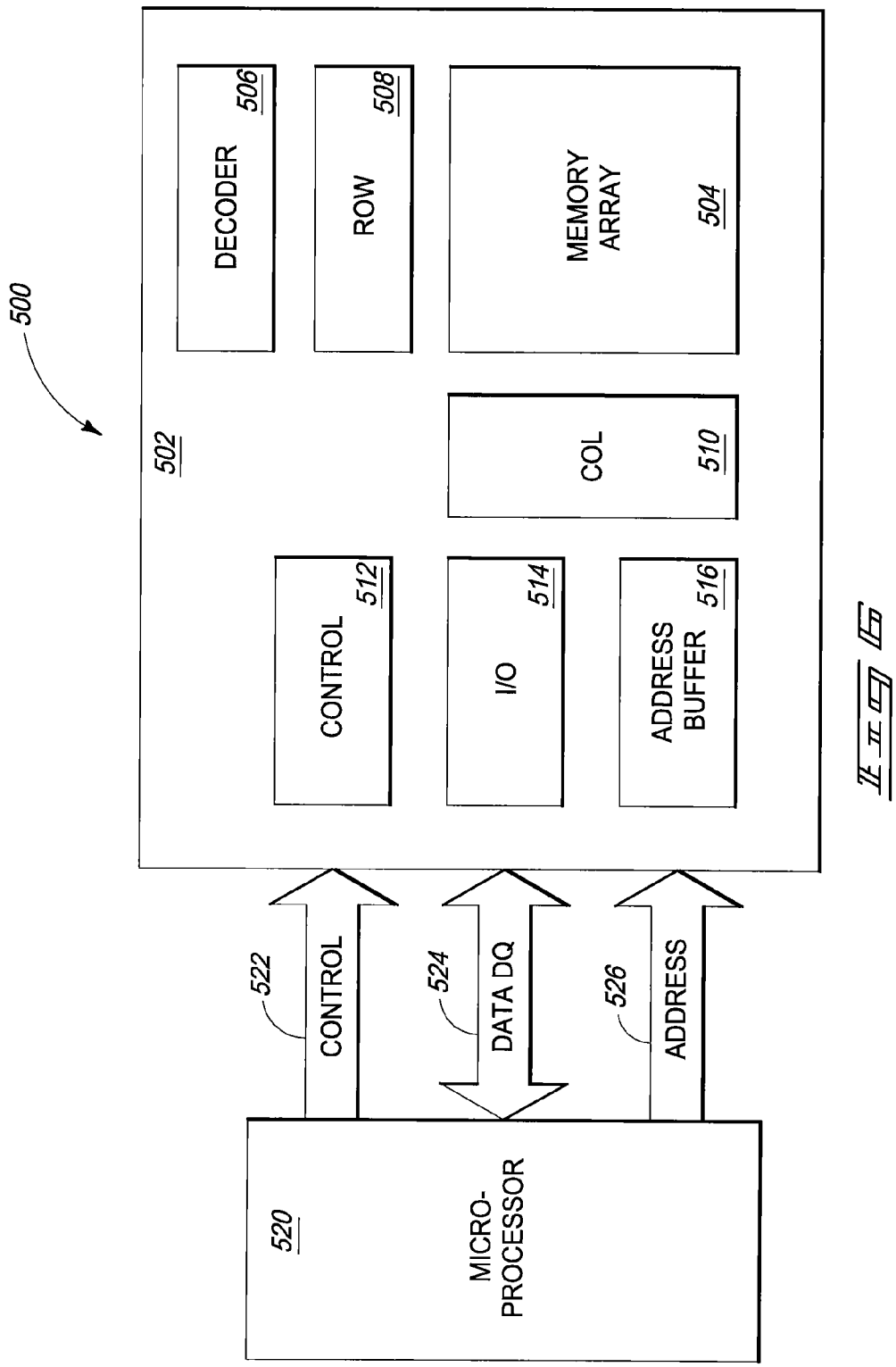
FIG. 6 is a simplified block diagram of a memory system in accordance with an example embodiment.
Figure 7:
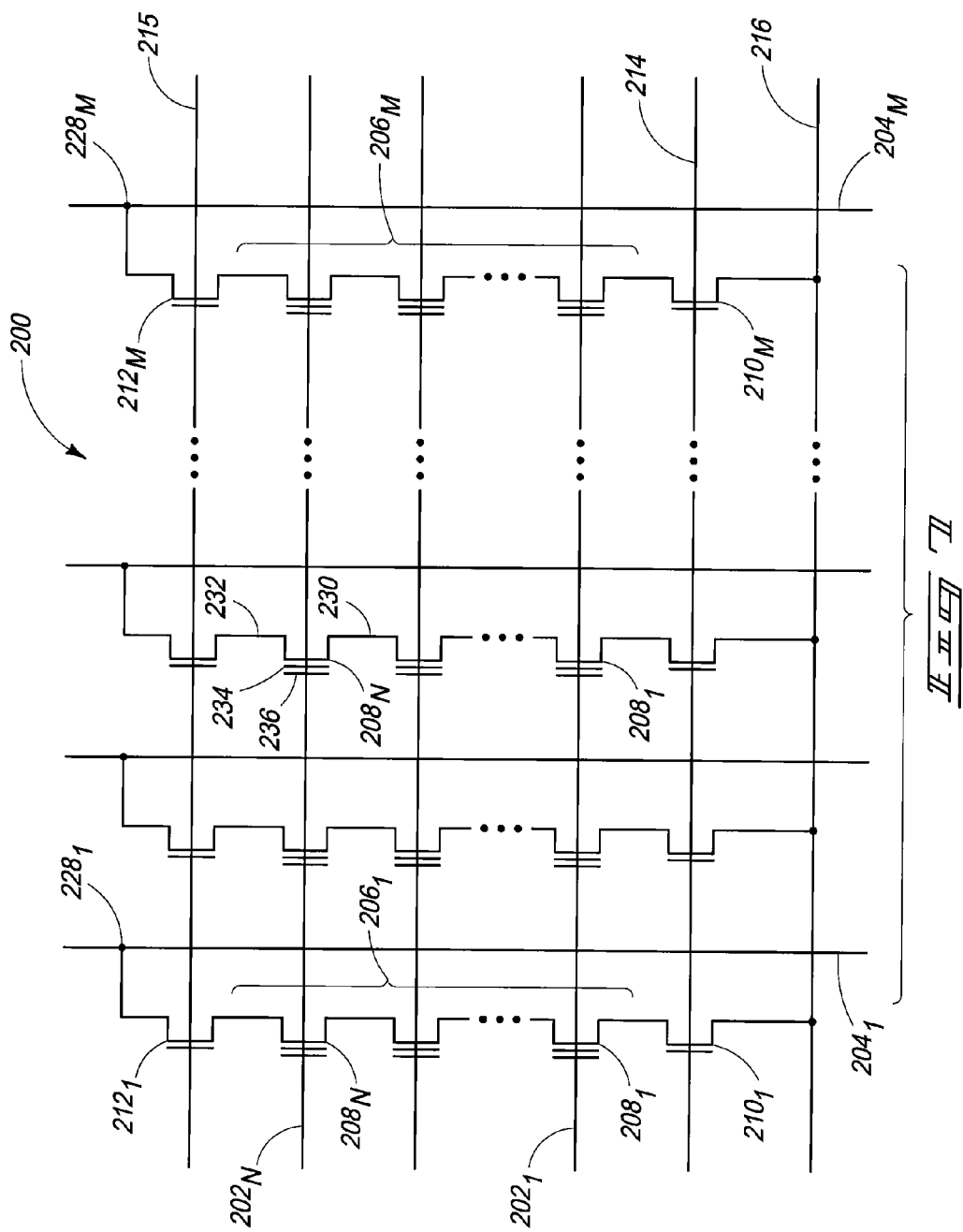
FIG. 7 is a schematic of a memory array in accordance with an example embodiment.

Some embodiments pertain to fabrication of structures associated with memory arrays (for instance, NAND memory or other non-volatile memory). FIGS. 6 and 7 illustrate example memory systems.

FIG. 6 is a simplified block diagram of a memory system 500. The memory system includes an integrated circuit flash memory device 502 (e.g., a NAND memory device), that includes an array of memory cells 504, an address decoder 506, row access circuitry 508, column access circuitry 510, control circuitry 512, input/output (I/O) circuitry 514, and an address buffer 516. Memory system 500 also includes an external microprocessor 520, or other memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

Figure 1:
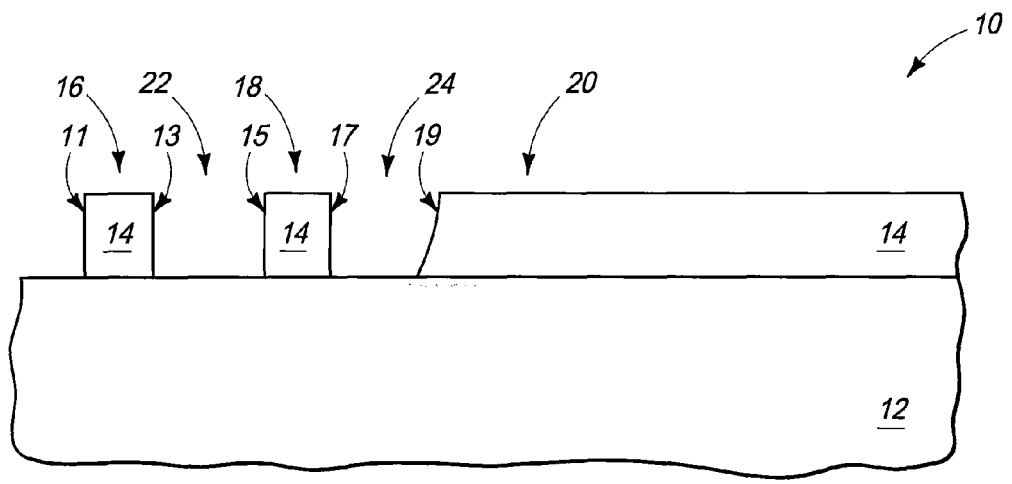
FIGS. 1-4 are diagrammatic, cross-sectional views of a portion of a semiconductor construction at various stages of a prior art fabrication sequence.
Figure 2:
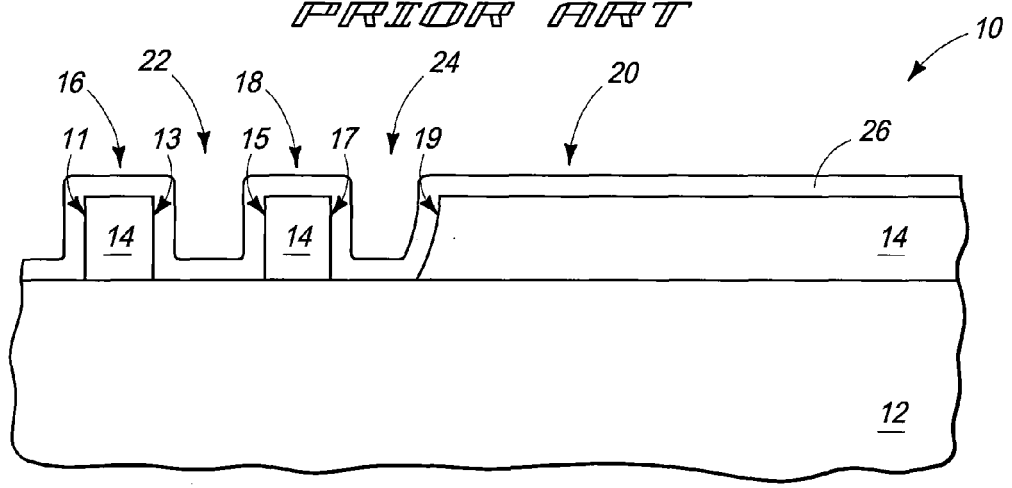
Figure 3:
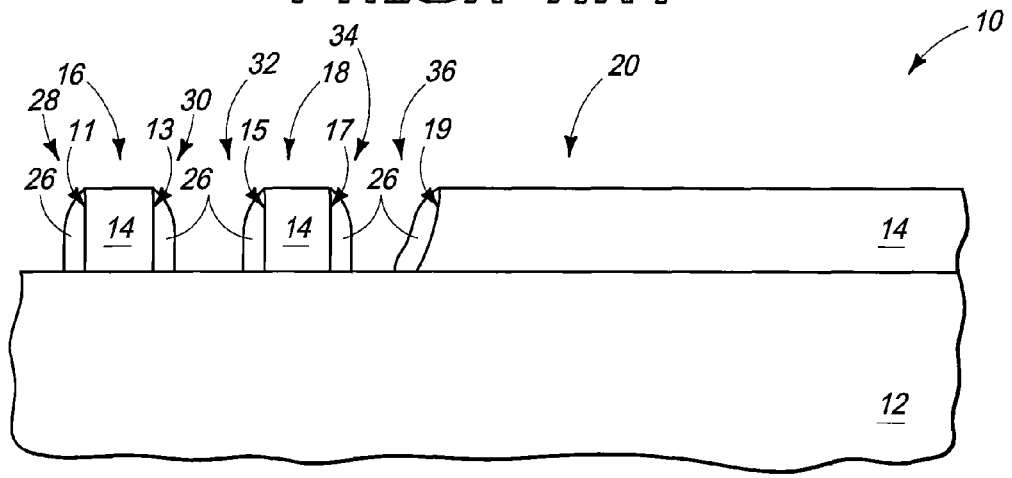
Figure 4:
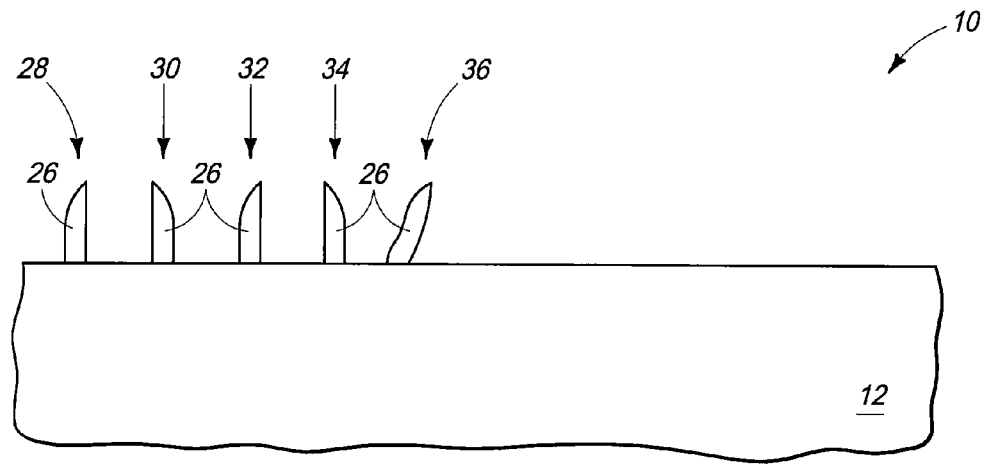
Figure 5:
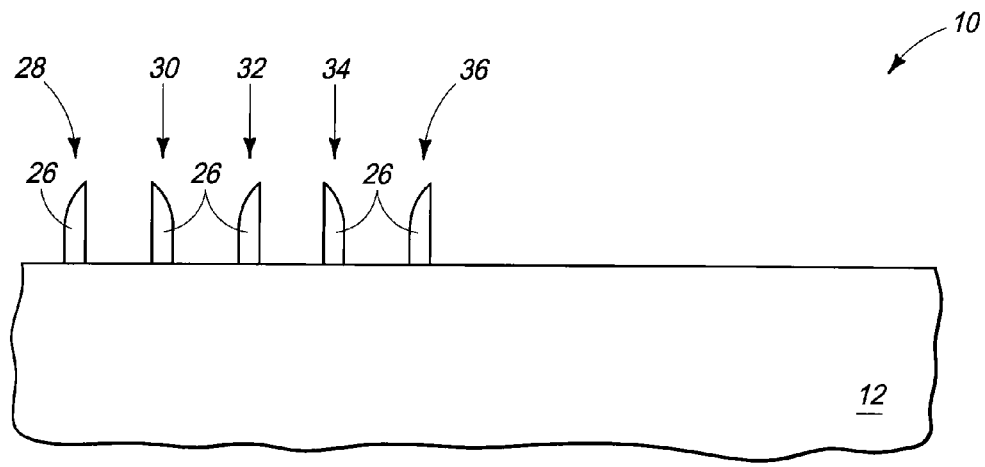
FIG. 5 is a diagrammatic, cross-sectional view of a portion of a semiconductor construction illustrating a pattern that is desired to be obtained at the processing stage of FIG. 4.

FIG. 7 is a schematic of a NAND memory array 200. Such may be a portion of memory array 504 of FIG. 1. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_1$. Each NAND string includes charge-storage transistors $208_1$ to $208_N$. The charge-storage transistors may use floating gate material to store charge, or may use charge-trapping material (such as, for example, metallic nanodots) to store charge.

The charge-storage transistors 208 are located at intersections of wordlines 202 and local bitlines 204. The charge-storage transistors 208 represent non-volatile memory cells for storage of data. The charge-storage transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first charge-storage transistor 208 of the corresponding NAND string 206. For example, the drain of source select gate $210_1$ is connected to the source of charge-storage transistor $208_1$ of the corresponding NAND string $206_1$. The source select gates 210 are connected to source select line 214.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last charge-storage transistor 208 of the corresponding NAND string 206. For example, the source of drain select gate $212_1$ is connected to the drain of charge-storage transistor $208_N$ of the corresponding NAND string $206_1$.

Charge-storage transistors 208 include a source 230, a drain 232, a charge storage region 234, and a control gate 236. Charge-storage transistors 208 have their control gates 236 coupled to a wordline 202. A column of the charge-storage transistors 208 are those transistors within a NAND string 206 coupled to a given local bitline 204. A row of the charge-storage transistors 208 are those transistors commonly coupled to a given wordline 202.

Figure 8:
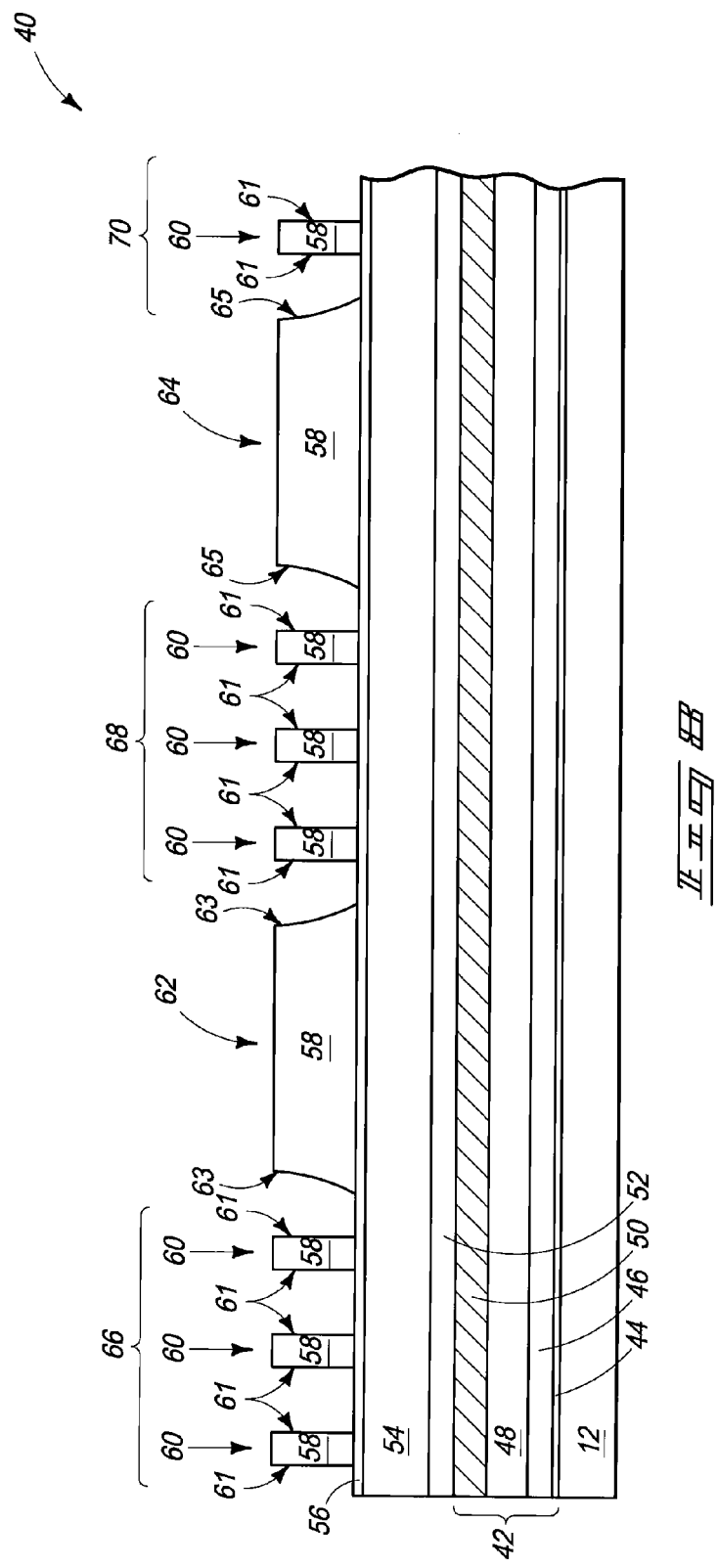
FIGS. 8 and 9 are diagrammatic, cross-sectional views of a portion of a semiconductor construction at various stages of a method of forming memory, and illustrate a problem that may result.
Figure 9:
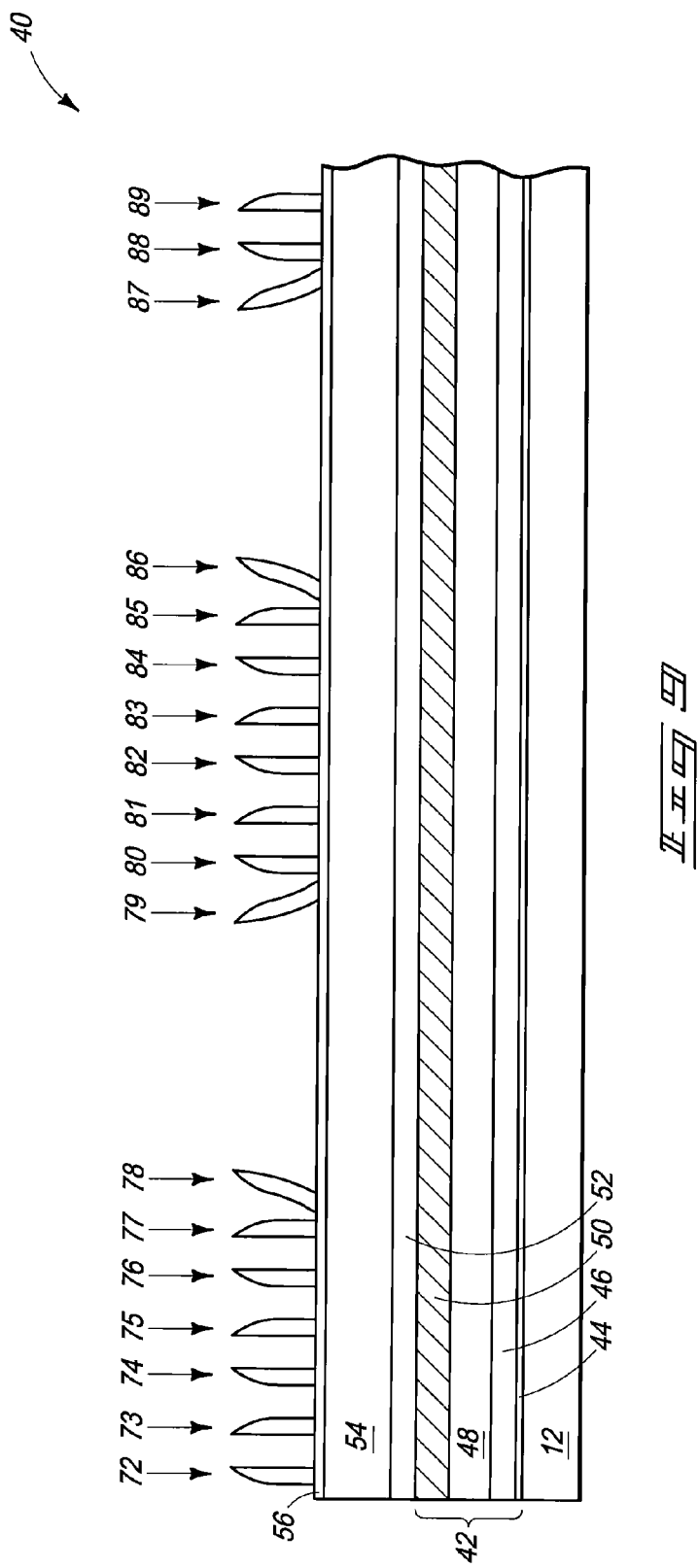

Some embodiments include methods in which the sizes of various photoresist features are tailored to avoid the non-vertical sidewalls discussed above in the "Background" section of this disclosure. One application in which such tailoring of photoresist feature size may be beneficial is in the fabrication of NAND memory. FIGS. 8 and 9 illustrate a process sequence which may be utilized for fabrication of NAND memory, and illustrate a problem that may occur if substantially different sizes of photoresist features are utilized.

Referring to FIG. 8, such shows a portion of a semiconductor construction 40. The construction 40 includes a semiconductor substrate 12, and such substrate may comprise any of the materials discussed above relative to the substrate 12 of the prior art constructions shown in FIGS. 1-4.

A gate stack 42 has been formed over substrate 12. The gate stack includes a tunnel dielectric material 44, a charge-storage material 46, a blocking dielectric material 48, and a control gate material 50. The various materials of the gate stack may be conventional materials utilized in fabrication of NAND string gates (or other memory cells). For instance, the tunnel dielectric material may comprise one or more of various electrically insulative oxides, (such as, for example, silicon dioxide); the charge-storage material may comprise floating gate material (e.g., polysilicon), or charge trapping material (e.g., silicon nitride, electrically conductive nanodots, etc.); the blocking dielectric material may comprise one or more electrically insulative oxides (e.g., one or more of hafnium oxide, aluminum oxide, zirconium oxide, etc.); and the control gate material may comprise one or more of various metals, metal-containing compositions, and conductively-doped semiconductor materials.

An electrically insulative capping layer 52 is over the gate stack. The electrically insulative capping layer may comprise any suitable composition or combination of compositions, and may, for example, comprise one or more of silicon nitride, silicon dioxide, and silicon oxynitride.

A carbon-containing layer 54 is over capping layer 52, and a deposited antireflective coating (DARC) layer 56 is over layer 54. The carbon-containing layer may comprise, consist essentially of, or consist of, for example, amorphous carbon.

Photolithographically-patterned photoresist 58 is over the DARC layer 56. The patterned photoresist is in the form of a plurality of narrow features 60, and a pair of wide features 62 and 64. The narrow features 60 form three distinct series 66, 68 and 70; and the wide features 62 and 64 are within gaps between such series.

The narrow features 60 have substantially vertical sidewall edges 61, whereas the wide features 62 and 64 have non-vertical sidewall edges 63 and 65, respectively. Some aspects of the invention include a recognition that the non-vertical sidewall edges result from attempting to pattern wide photoresist features and narrow photoresist features with a common reticle.

The processing stage of FIG. 8 may be directly after photolithographic processing of the photoresist 58, or there may be an intervening photoresist trim conducted after the photolithographic processing and prior to the processing stage of FIG. 8. Photoresist trimming is commonly utilized during fabrication of NAND memory to reduce photoresist feature sizes to levels smaller than those achieved with photolithographic processing alone. Any suitable conditions may be utilized for the photoresist trimming, such as, for example, utilization of $CF_4$ with an $O_2$ plasma.

Referring next to FIG. 9, construction 40 is shown at a processing stage after spacers 72-89 have been formed along the edges 61, 63 and 65 of the photoresist features 60, 62 and 64, and after the photoresist features 60, 62 and 64 have then been removed. The spacers may be formed by processing analogous to that described below with reference to FIGS. 11 and 12. In subsequent processing, the spacers may be used as a mask to pattern the underlying gate stack 42 into a plurality of NAND string gates. In other words, each of the spacers 72-89 may define a pattern of an individual NAND string gate. A problem that occurs is that the spacers 78, 79, 86 and 87 that were formed along edges 63 and 65 have a different shape than the other spacers, and such may detrimentally affect NAND string gates patterned from spacers 78, 79, 86 and 87.

FIGS. 10-16 described a processing sequence that may be utilized alternatively to that of FIGS. 8 and 9, and which may avoid the defective shapes of spacers 78, 79, 86 and 87. Similar numbering will be used to describe FIGS. 10-16 as is used to describe FIGS. 8 and 9, where appropriate.

Figure 10:
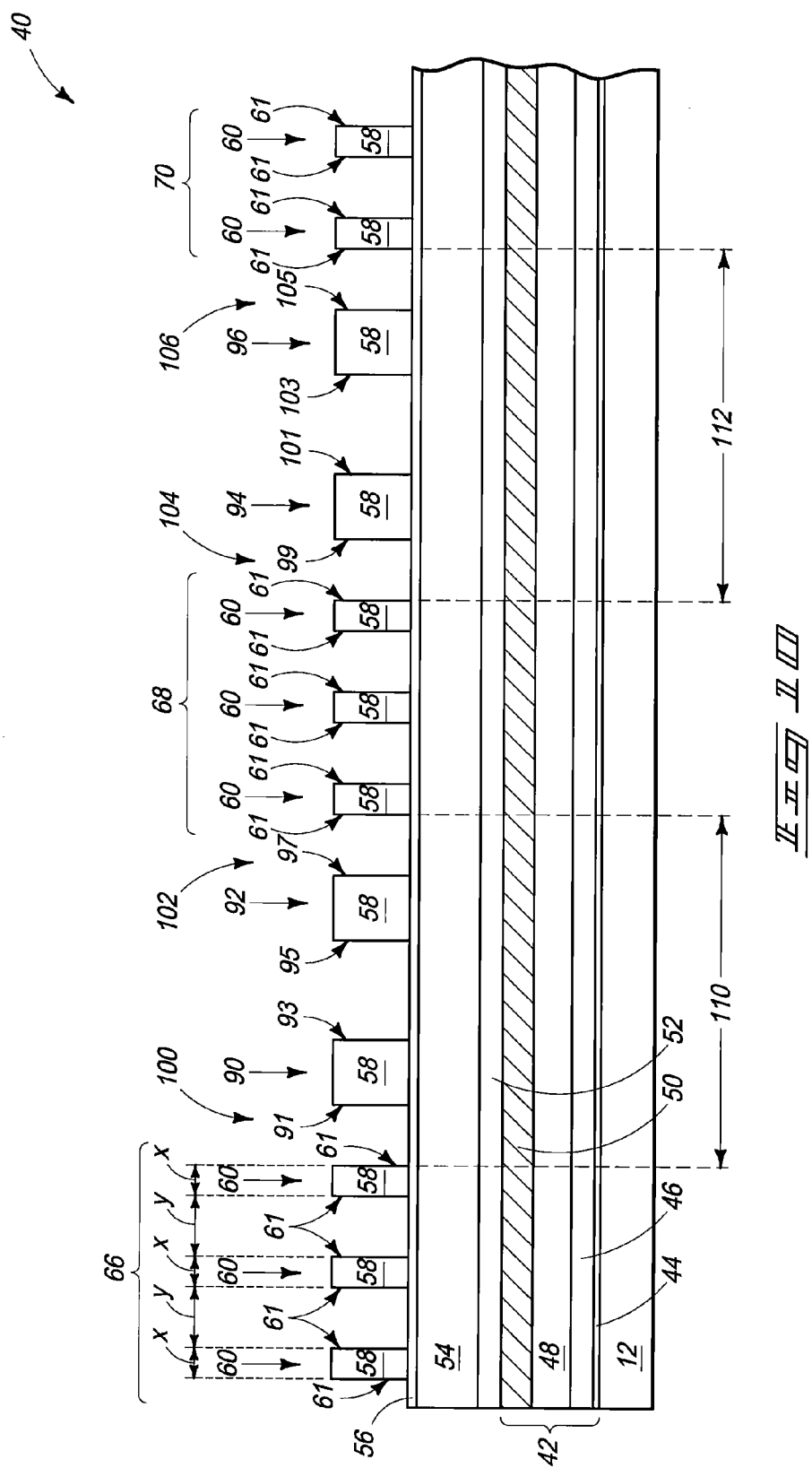

Referring to FIG. 10, construction 40 is shown at a processing stage analogous to that of FIG. 8. However, unlike the construction of FIG. 8, that of FIG. 10 has a pair of smaller photoresist features 90 and 92 between the series 66 and 68 of narrow features 60, and has a pair of smaller photoresist features 94 and 96 between the series 68 and 70. Thus, the large photoresist feature 62 of FIG. 8 has been replaced with a smaller photoresist features 90 and 92, and similarly the large photoresist feature 64 of FIG. 8 has been replaced with smaller photoresist features 94 and 96.

An advantage of utilizing the smaller photoresist features instead of the large photoresist features is that the problems of attempting to simultaneously photolithographically pattern large and small photoresist features is avoided. Accordingly, photoresist features 90, 92, 94 and 96 may be formed with the vertical sidewall edges 91, 93, 95, 97, 99, 101, 103 and 105, as shown.

The relative widths of the photoresist features 90, 92, 94 and 96 to the other photoresist features 60 may be anything suitable to avoid the sloped-sidewall problem of FIG. 8. In the shown embodiment, the photoresist features 60 are substantially identical to one another, and thus all have about the same lateral width as one another (in other words, are all of about a uniform lateral width, with such lateral width being labeled "x" in FIG. 10), and are laterally spaced apart from one another by uniform spaces of a lateral width labeled "y" in FIG. 10. The relationship of width "x" to width "y" may be tailored so that spacers patterned along the sidewall edges of features 60 (for instance, the spacers 118 of FIG. 13) form a uniform repeating pattern. The distance "y" may be referred to as a common distance that spaces adjacent features 60 from one another.

The photoresist features 60 may be considered to be formed at a first pitch, and ultimately may be utilized to form a pattern of spacers (for instance, the spacers 118 of FIG. 13) at a second pitch that is approximately half of the first pitch.

In some embodiments, the photoresist features 60 may have widths of from about 10 nanometers to about 70 nanometers, and the photoresist features 90, 92, 94 and 96 may have widths that are no more than about three times the widths of features 60. In some example embodiments, the photoresist features 90, 92, 94 and 96 may have widths of from about 10 nanometers to about 200 nanometers; in some example embodiments may have widths of from about 40 nanometers to about 200 nanometers; and in some example embodiments may have widths of about 50 nanometers to about 150 nanometers.

In some example embodiments, each of the photoresist features 90, 92, 94 and 96 may be considered to be formed at the end of a line corresponding to one of the series 66, 68 and 70 of the features 60. For instance, feature 90 may be considered to be formed at the end of a line corresponding to the series 66 of features 60. The feature 90 is spaced from the nearest adjacent feature of series 66 by a gap 100. Similarly, feature 92 is spaced from a nearest adjacent feature of series 68 by a gap 102, feature 94 is spaced from a nearest adjacent feature of series 68 by a gap 104, and feature 96 is spaced from a nearest adjacent feature of series 70 by a gap 106. The gaps 100, 102, 104 and 106 may have lateral widths of the same dimension "y" that corresponds to the spacing between adjacent features 60. In other embodiments, one or more of the gaps 100, 102, 104 and 106 may have a lateral width that is substantially different from the lateral width "y" separating adjacent features 60 from one another.

In some example embodiments, each series 66, 68 and 70 may be considered to have a pair of opposing ends (with both ends of series 68 being visible in the illustration of FIG. 10), and additional photoresist blocks may be considered to be formed at each of the opposing ends (with photoresist blocks 92 and 94 being formed at the opposing ends of series 68 in the illustration of FIG. 10).

In some example embodiments, the photoresist features 90, 92, 94 and 96 may be considered placeholders, in that each ultimately holds the place for a location of a vertical structure that is to be formed along a sidewall edge of the photoresist feature (with such vertical structures being shown and described with reference to FIGS. 12-16).

In some example embodiments, series 66, 68 and 70 may be considered to correspond to sets of features 60 that are spaced from one another by intervening regions 110 and 112; and the additional photoresist features 90, 92, 94 and 96 may be considered to be formed within such intervening regions. For instance, series 66 may be considered to be a first line of the features 60, and series 68 may be considered to be a second line of the features 60. The features 90 and 92 may be considered to be additional photoresist features that are formed within the intervening region 110 between the first and second lines. The feature 90 may be considered to be formed adjacent an end of the first line 66, and similarly the feature 92 may be considered to be formed adjacent an end of the second line 68.

Figure 11:
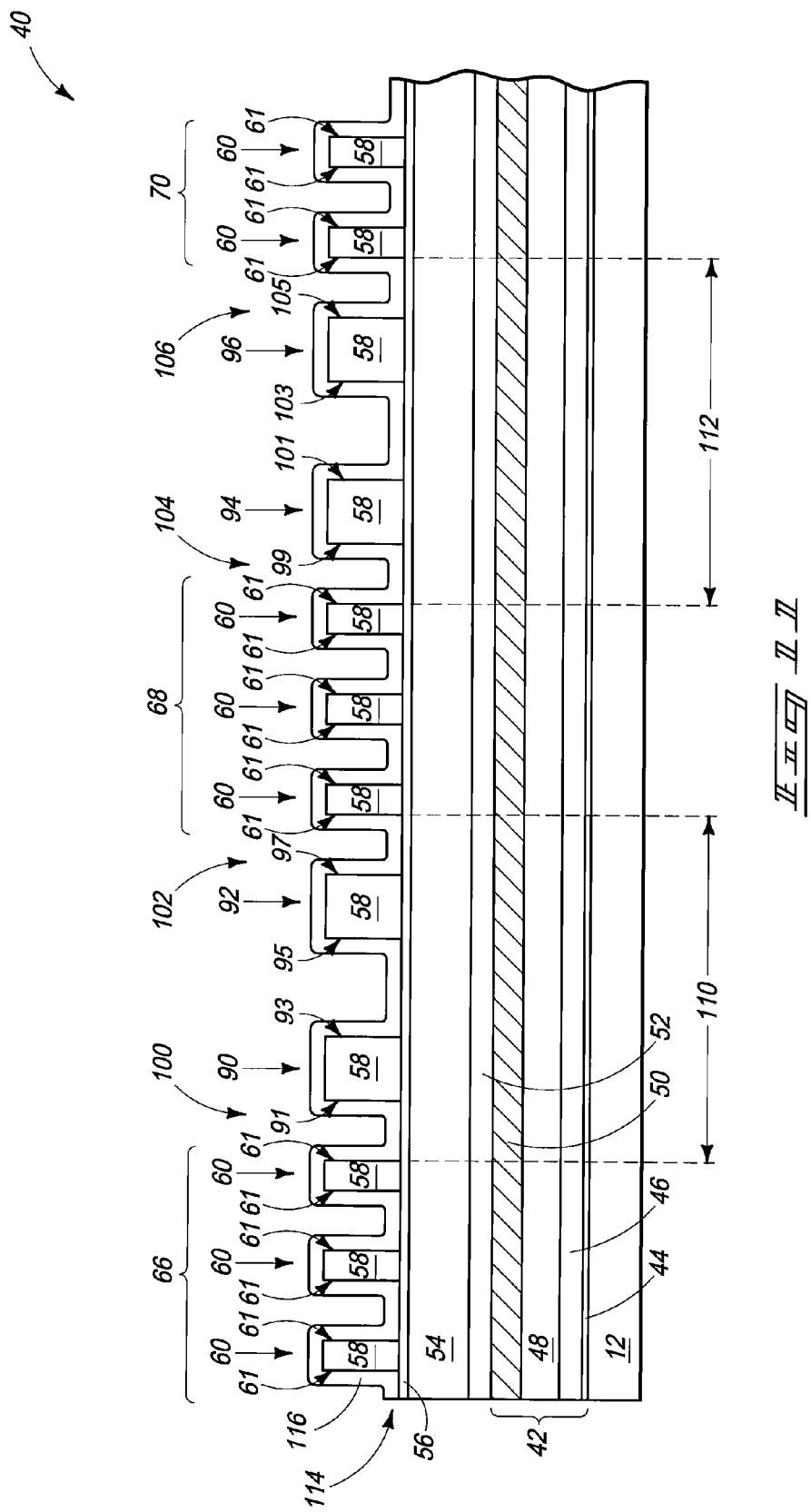

Referring to FIG. 11, a layer 114 of material 116 is formed over and between features 60; over and between features 90, 92, 94 and 96; and within the gaps 100, 102, 104 and 106. Layer 114 may be formed to any suitable thickness, such as, for example, a thickness of from about 10 nanometers to about 60 nanometers.

Material 116 may comprise any suitable composition or combination of compositions. In some embodiments, material 116 will be a sacrificial masking material. In such embodiments, material 116 may comprise a material which is relatively low-cost, and easy to conformally deposit over and between the various features 60, 90, 92, 94 and 96. For instance, material 116 may comprise, consist essentially of, or consist of silicon dioxide formed by atomic layer deposition (ALD) or chemical vapor deposition (CVD).

Figure 12:
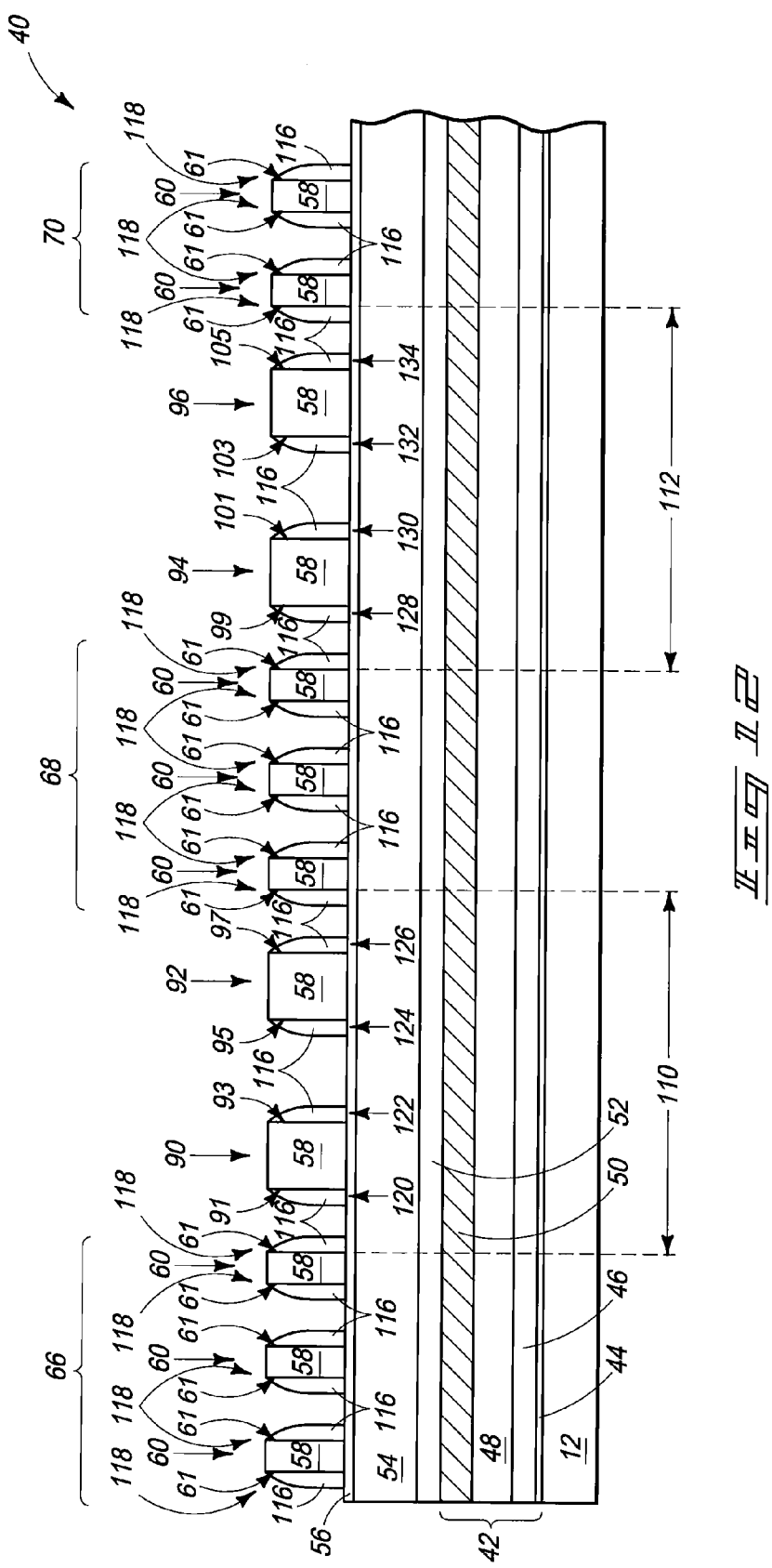
Figure 11:
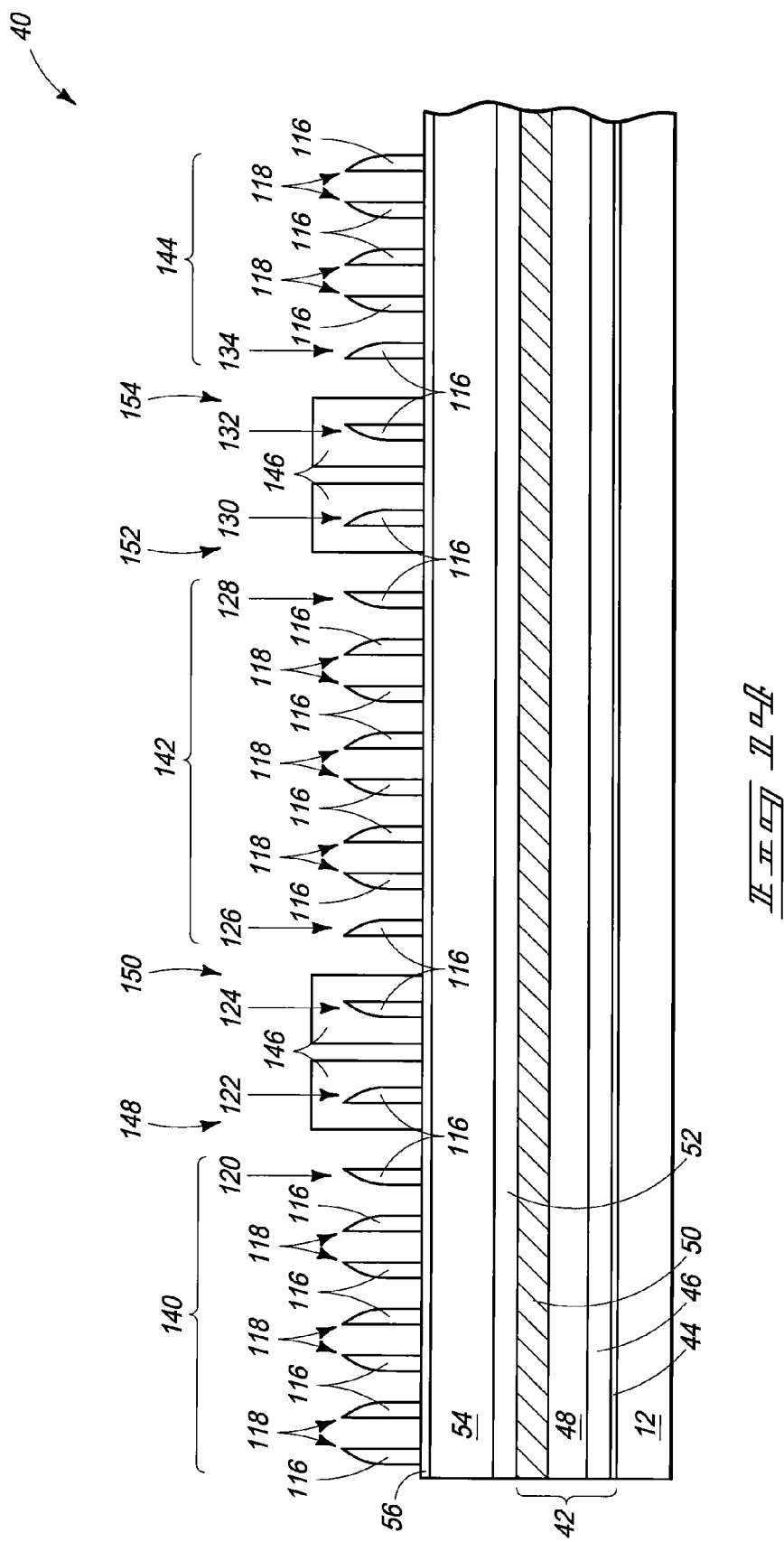

Referring to FIG. 12, material 116 is anisotropically etched to form a plurality of spacers 118 along the sidewall edges 61 of photoresist features 60, and to form spacers 120, 122, 124, 126, 128, 130, 132, and 134 along sidewall edges 91, 93, 95, 97, 99, 101, 103 and 105, respectively. The sidewall edges 61, 91, 93, 95, 97, 99, 101, 103 and 105 are all substantially vertical; and accordingly the spacers 118, 120, 122, 124, 126, 128, 130, 132, and 134 are all vertical structures.

The spacers 118 correspond to patterned structures that will ultimately be utilized for forming NAND string gates from the underlying gate stack 42. Also, the spacers along the sidewall edges 91, 97, 99 and 105 of placeholders 90, 92, 94 and 96 will be utilized for forming NAND string gates from the underlying gate stack. Specifically, the spacers 118 along sidewall edges of the features 60 of series 66, together with the spacer 120 formed sidewall edge 91 of placeholder 90, will be used to form a first set 140 (shown in FIG. 13) of NAND string gates; the spacers 118 along sidewall edges the features 60 of series 68, together with the spacer 126 along sidewall edge 97 of placeholder 92 and the spacer 128 along sidewall edge 99 of placeholder 94, will be used to form a second set 142 (shown in FIG. 13) of NAND string gates; and the spacers 118 along sidewall edges of the features 60 of series 70, together with the spacer 134 formed sidewall edge 105 of placeholder 96, will be used to form a third set 144 (shown in FIG. 13) of NAND string gates.

Referring to FIG. 13, photoresist 58 (FIG. 12) is removed, while leaving spacers 118, 120, 122, 124, 126, 128, 130, 132 and 134 over layer 56. Some of the spacers are grouped amongst the sets 140, 142 and 144. The sets 140, 142 and 144 may correspond to locations of three of the NAND strings $206_1$ through $206_M$ of FIG. 7.

Referring to FIG. 14, patterned masking material 146 is provided over DARC layer 56 of construction 40. The patterned masking material forms a plurality of separate features (or masks) 148, 150, 152 and 154 that will ultimately be utilized for patterning select gates of NAND memory cells (such select gates are shown and described with reference to FIG. 16). The spacers 122, 124, 130 and 132 are buried under masks 148, 150, 152 and 154, respectively; and accordingly are covered by the masks. In contrast, the spacers corresponding to string gate sets 140, 142 and 144 (specifically, spacers 118, 120, 126, 128 and 134) remain uncovered.

Although the spacers 122, 124, 130 and 132 are shown to be centrally located within the masks 148, 150, 152 and 154, respectively; in other embodiments, one or more of the spacers may be offset relative to a central location under the corresponding mask.

Masking material 146 may comprise any suitable composition or combination of compositions, and in some example embodiments may comprise, consist essentially of, or consist of photographically-patterned photoresist.

There are numerous ways of describing the various structural elements of FIG. 14. In some embodiments, spacers 126 and 128 may be considered first and second spacers that were formed on opposing sides of the series 68 (FIG. 12) of spaced apart features 60. In such embodiments, the spacers 124 and 130 may be referred to as third and fourth spacers, respectively; and may be considered to be covered by first and second masks 124 and 130, respectively, at the processing stage of FIG. 14.

In some example embodiments, the processing stage of FIG. 14 may be considered to comprise a plurality of vertical structures 118, 120, 122, 124, 126, 128, 130, 132 and 134 that are the same in composition and shape as one another; with some of such structures being covered by masking material 146 and others of such structures remaining uncovered. In some embodiments, the various vertical structures within each of the sets 140, 142 and 144 (specifically, the structures 118, 120, 126, 128 and 134) may be spaced from one another by uniform intervals.

Referring to FIG. 15, DARC layer 56 and carbon-containing layer 54 are etched while using masks 148, 150, 152 and 154—together with structures 118, 120, 126, 128 and 134—to define patterns that are to be transferred into the layers 54 and 56. The etching may utilize conventional chemistries suitable for etching into DARC and carbon. The etching may remove some of material 116 of the structures 118, 120, 126, 128 and 134 (as shown), and such removal may be tailored so that the patterns formed from each of the structures 118, 120, 126, 128 and 134 are substantially identical to one another in spite of minor asymmetry in the original structures. Such asymmetry was due to some of the structures having been formed on a left sidewall edge of photoresist features (specifically, the photoresist features 60, 90, 92, 94 and 96 of FIG. 12), while others of the structures were formed on the right sidewall edges of the photoresist features.

Figure 16:
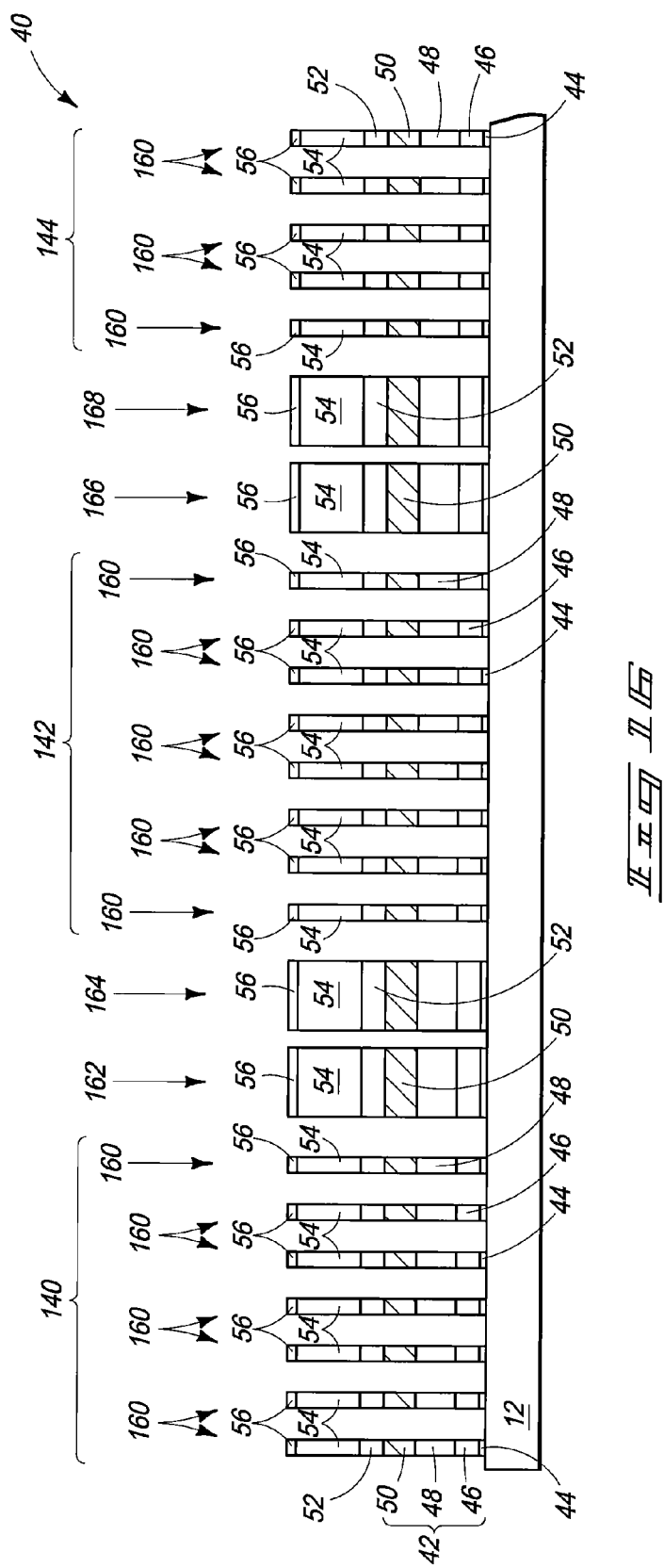

Referring to FIG. 16, patterned layers 54 and 56 are utilized as a mask during an etch of the underlying materials 44, 46, 48, 50 and 52. Such forms a plurality of NAND string gates 160 from the gate stack 42, and also forms select gates 162, 164, 166 and 168 from such gate stack. The NAND string gates are arranged in the sets 140, 142 and 144 that had been defined by the structures 118, 120, 126, 128 and 134 at the processing stage of FIG. 14. The select gates are at locations defined by the masks 148, 150, 152 and 154 at the processing stage of FIG. 14. As discussed earlier in this application, the term "substrate" may comprise a single material, or may comprise multiple materials. In some embodiments, the etching into materials 44, 46, 48, 50 and 52 may be considered to be etching into a substrate.

The NAND gates may be incorporated into the transistors 208 of FIG. 7, and accordingly the sets 140, 142 and 144 may correspond to three of the NAND strings $206_1$ through $206_M$ of FIG. 7. The select gates 162, 164, 166 and 168 may correspond to various of the source select gates 210 and drain select gates 212 of FIG. 7. In some embodiments, the select gates 162 and 164 may be considered to be a first pair of select gates, while the select gates 166 and 168 may be considered to be a second pair. The first pair may be source select gates, and the second pair may be drain select gates; or vice versa. Source contacts may be formed between the source select gates, and drain contacts may be formed between the drain select gates, utilizing conventional methods.

The illustration of FIG. 16 shows one complete set of NAND string gates (142), and two partial sets 140 and 144. In the shown embodiment, the complete set contains eight string gates. In other embodiments, there may be more than eight string gates in a complete set, or less than eight string gates.

Although the processing of FIGS. 10-16 utilizes the spacers as a mask to pattern underlying conductive material, in other embodiments (not shown), the spacers may be utilized for other purposes; such as, for example, for patterning semiconductive materials, for patterning electrically insulative materials, and/or for patterning a subsequent dopant implant. Also, in some embodiments the spacers may be used for patterning a conductive material by depositing the conductive material in gaps between the spacers; alternatively to, or additionally to, using the spacers as a mask to pattern underlying conductive material.

Persons of ordinary skill in the art will recognize that there are darkfield masks and clearfield masks; that there are positive tone photoresists and negative tone photoresists; and that the different types of mask may be combined with different types of photoresists in various applications. The present invention may be utilized with any combination of mask type and photoresist type.

Figure 20:
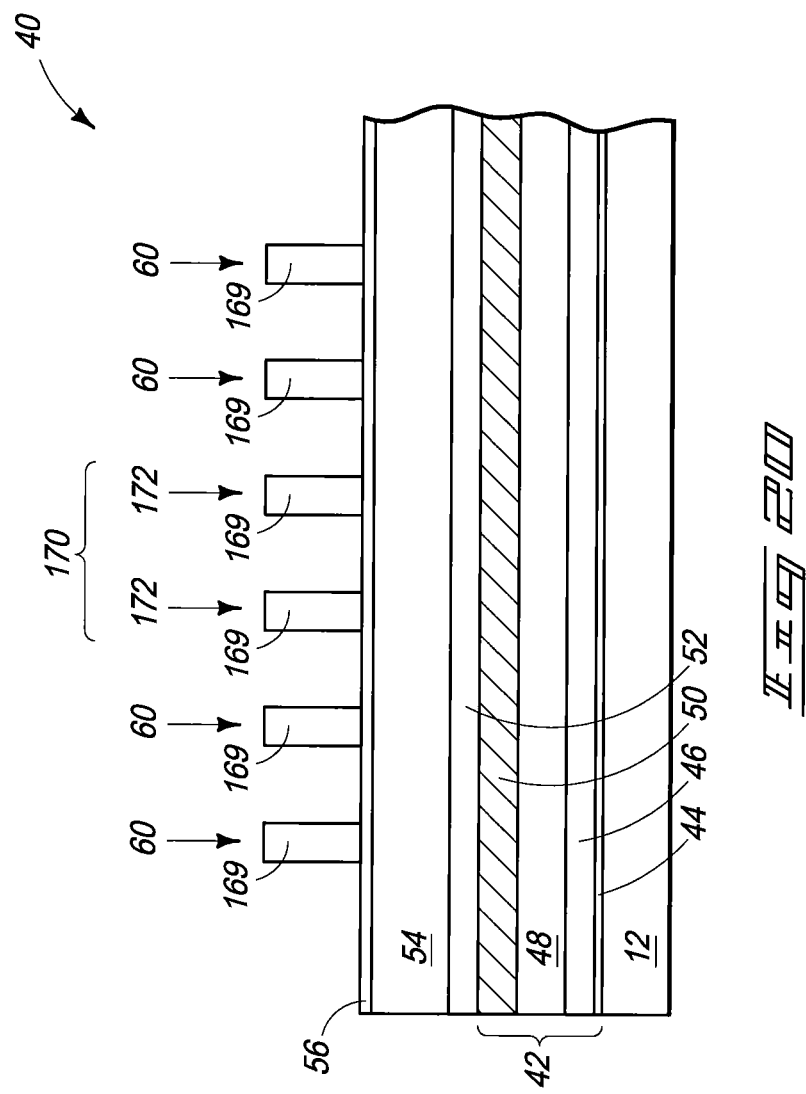
FIGS. 20-22 are diagrammatic, cross-sectional views of a portion of a semiconductor construction at various stages of another example embodiment method.
Figure 21:
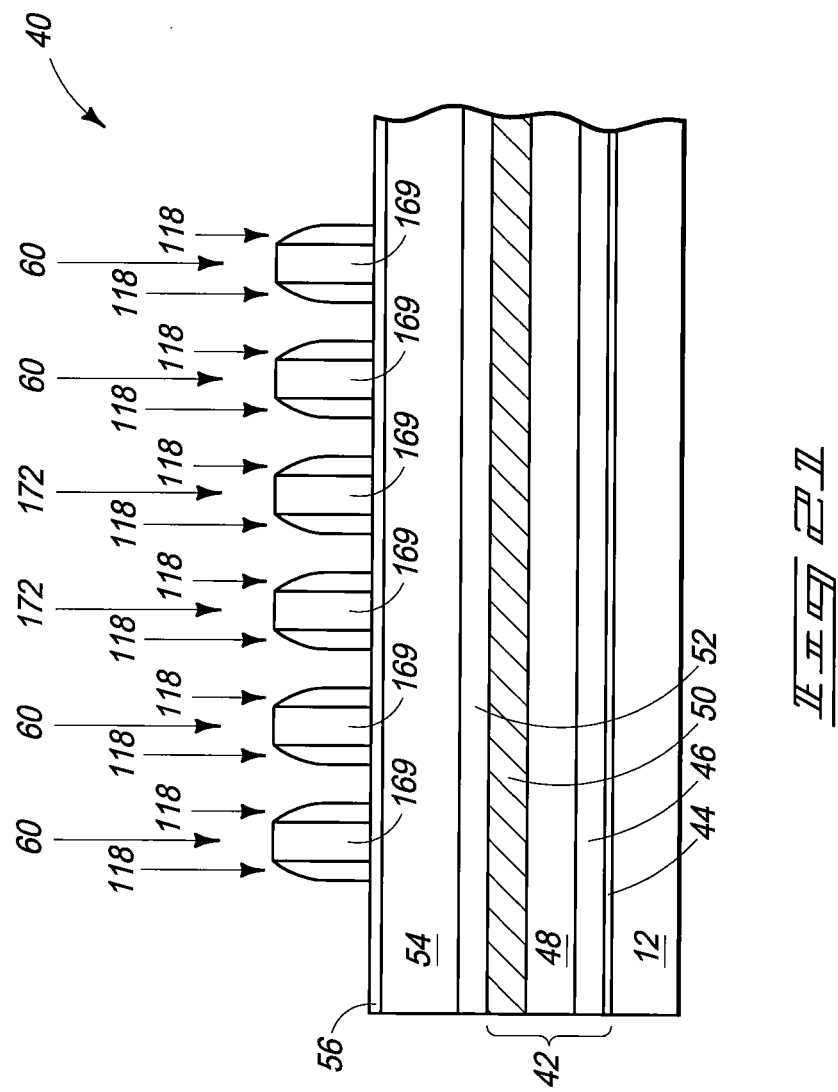
Figure 22:
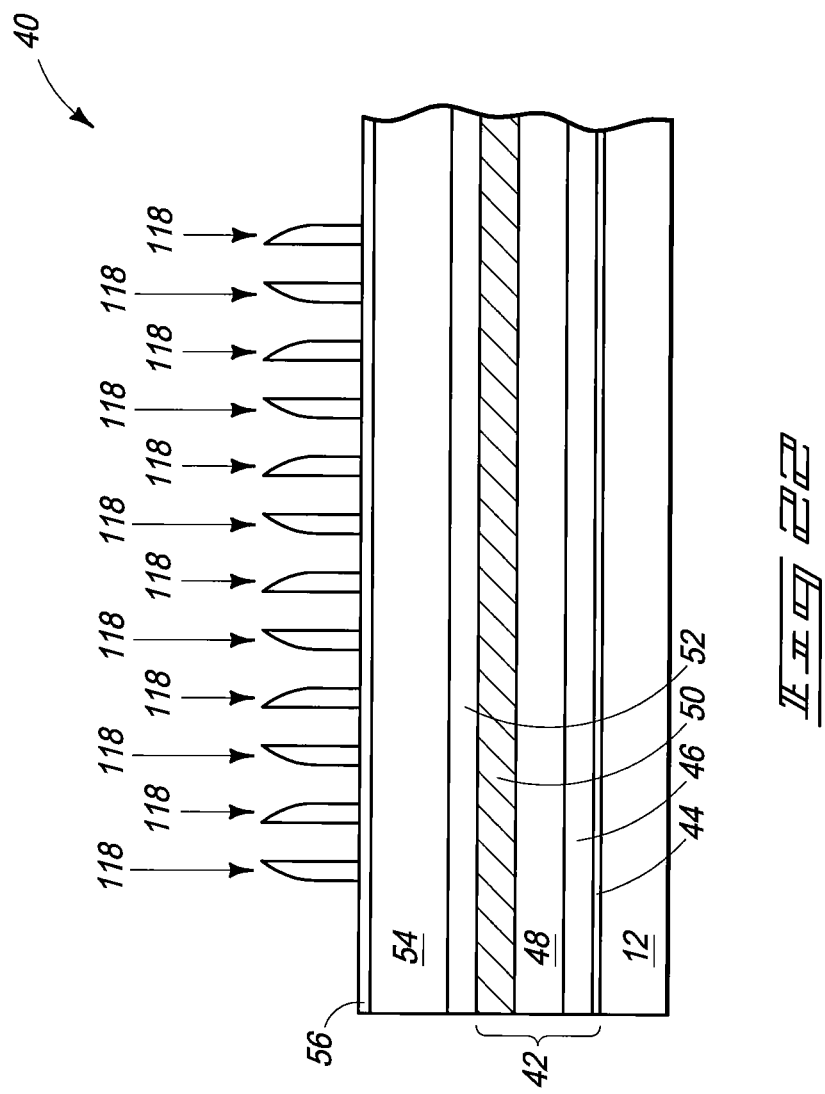

FIGS. 20-22 illustrate an example embodiment in which spacers analogous to those formed with the processing described above (specifically, those described with reference to FIGS. 10-16) may be formed with an opposite tone photoresist to the tone shown in the preceding drawings; so that the spacers are formed at the same locations (i.e., along edges of photoresist features), but in a reversed orientation along the edges relative to the orientation of the preceding drawings. The difference between positive tone photoresist and negative tone photoresist is in whether regions exposed to actinic radiation are ultimately removed during development of the photoresist, or if it is instead regions that have not been exposed to actinic radiation that are ultimately removed during development of the photoresist.

Prior to describing the embodiments of FIGS. 20-22, a problem is described with reference to FIGS. 17-19.

Figure 17:
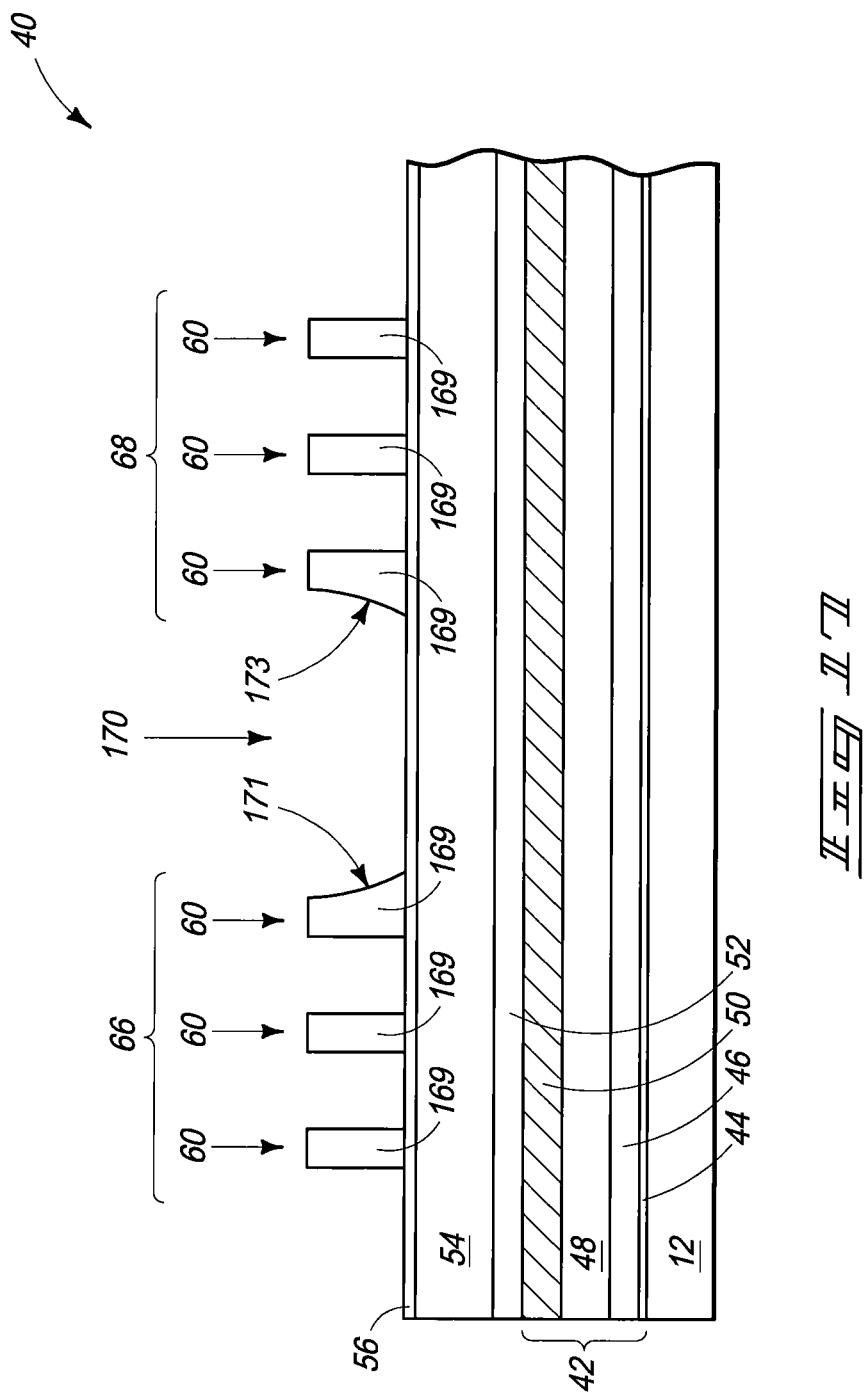
FIGS. 17-19 are diagrammatic, cross-sectional views of a portion of a semiconductor construction at various stages of a semiconductor fabrication sequence, and illustrate a problem that may result.

FIG. 17 shows a portion of construction 40 at the processing stage of FIG. 8, but with a different type of photoresist (169) than the photoresist 58 that had been utilized in FIG. 8. Specifically, the processing stage of FIG. 17 has features 60 in locations that had been gaps at the processing stage of FIG. 8, and has gaps at locations where the features had been that the processing stage of FIG. 8. The edges of the features 60 of FIG. 17 will be at the same locations as the edges 60 of the features of FIG. 8, and thus the spacers ultimately formed along such edges will be the same locations regardless of whether the processing of FIG. 17 is utilized, or the processing of FIG. 8 is utilized.

A difference between the processing of FIG. 17 and that of FIG. 8 is that the construction of FIG. 17 has a long gap 170 between the series 66 of features 60 and the series 68 of features 60, whereas the construction of FIG. 8 had a large segment of photoresist between the series 66 of features 60 and the series 68 of features 60. However, regardless of whether there is a long gap between features, or a long segment of photoresist, problems with the photoresist patterning can occur to create non-vertical sidewalls, as illustrated by non-vertical sidewalls 171 and 173 on opposing sides of gap 170.

Figure 18:
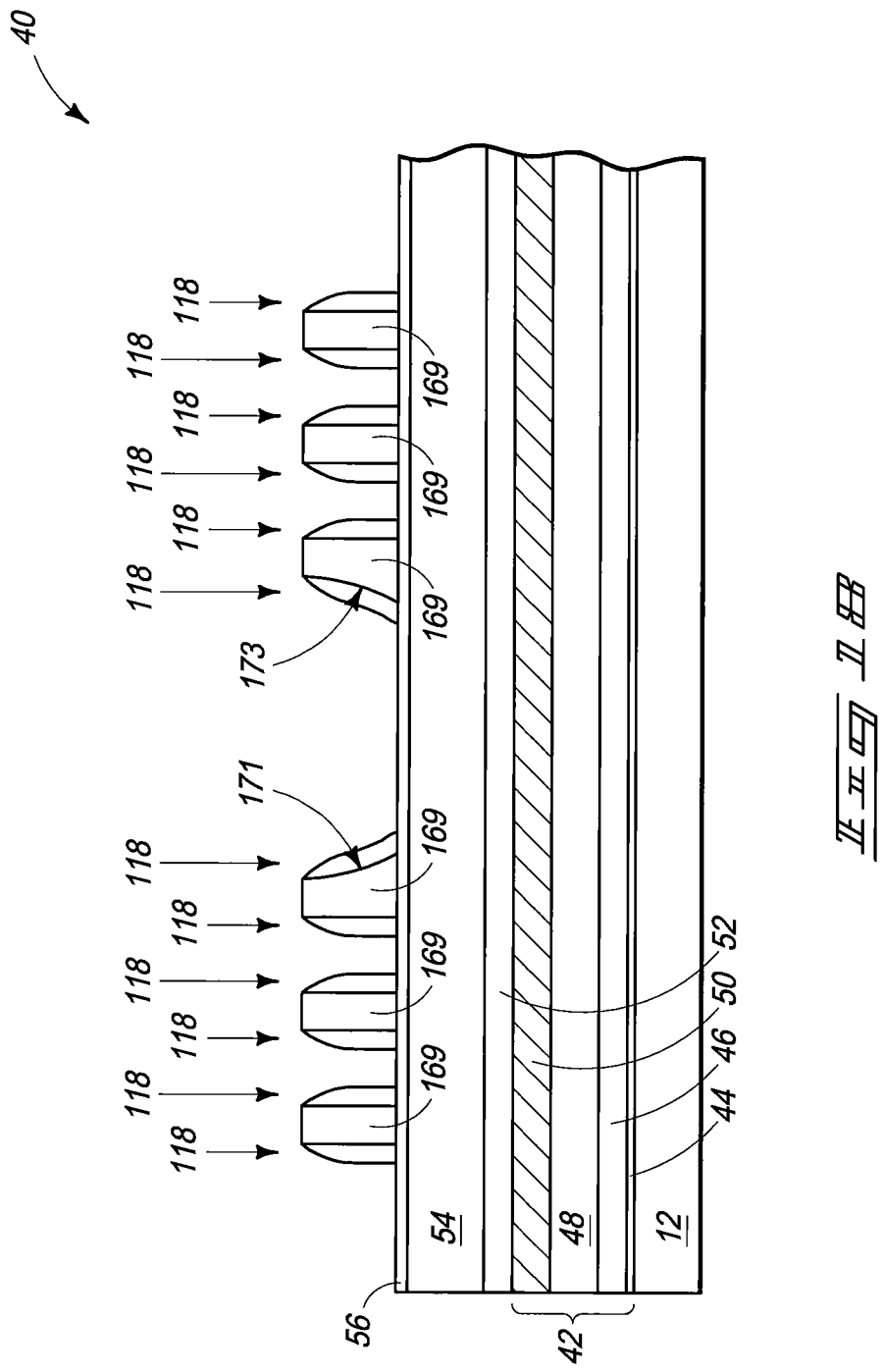
Figure 19:
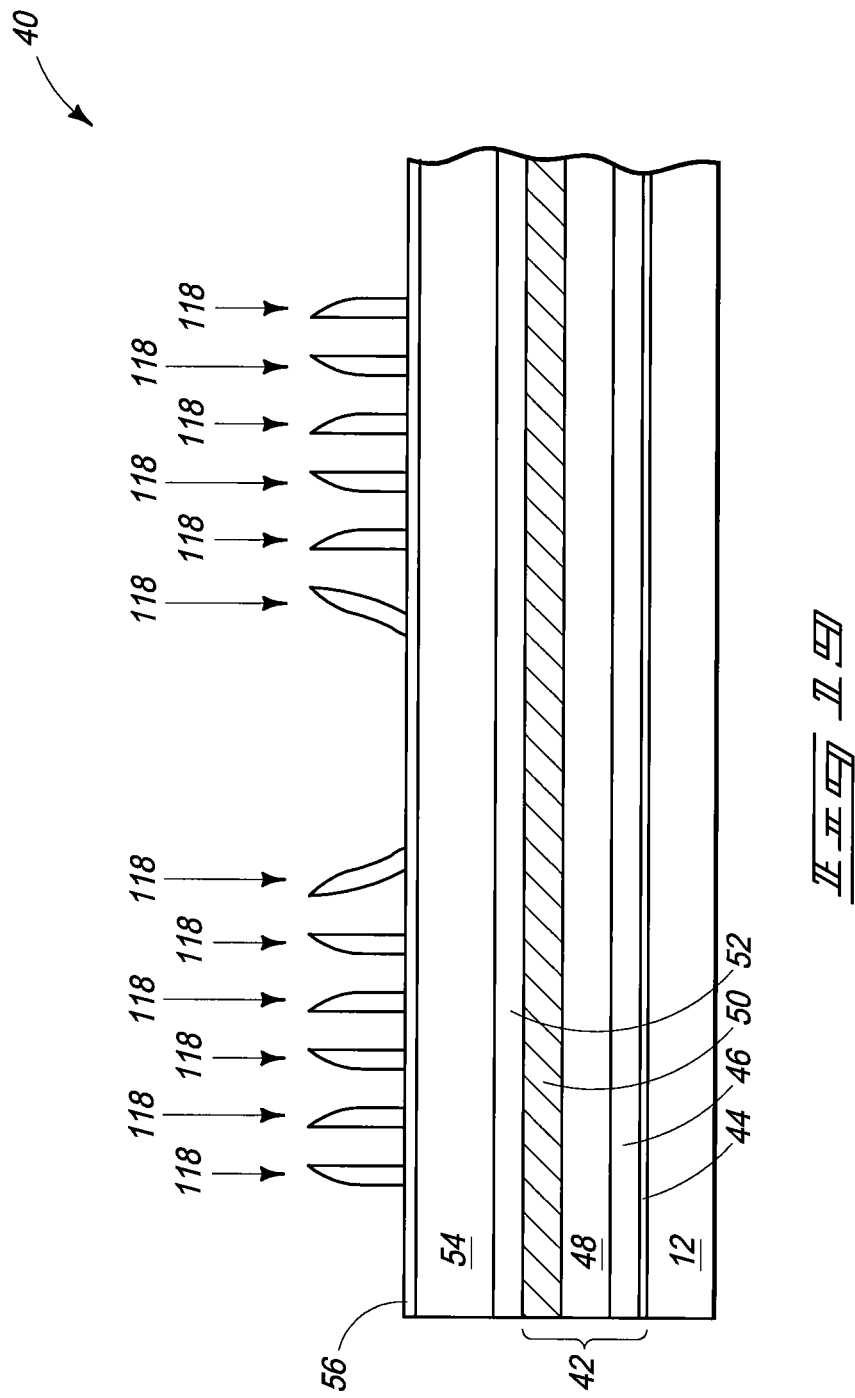

Spacers 118 may be formed along the sidewall edges of features 60 (as shown in FIG. 18), utilizing methods analogous to those discussed above with reference to FIGS. 11 and 12. The spacers along the non-vertical edges 171 and 173 are of a different shape than the other spacers. Once photoresist 169 is removed, a construction shown in FIG. 19 results. Some of the spacers 118 of FIG. 19 are substantially different than others of the spacers. This may create serious complications in subsequent processing.

FIGS. 20-22 describe an example embodiment that may cure the problem described with reference to FIGS. 17-19. FIG. 20 shows construction 40 at the processing stage of FIG. 17, but after a couple of additional photoresist features 172 are formed in the region that previously been gap 170. The addition of photoresist features within the gap improves photolithographic processing, so that all the photoresist features now have substantially vertical sidewalls. Subsequently, spacers 118 may be formed along the various photoresist features 60 and 172 (as shown in FIG. 21), and then the masking material 169 may be removed to leave the construction shown in FIG. 22. The spacers that have been formed adjacent the extra features 172 (FIG. 21) may be unnecessary in processing that occurs subsequent to the stage of FIG. 22. If so, such extra spacers may be removed. Alternatively, the extra spacers may be covered with masking material in processing analogous to that discussed above with reference to FIG. 14.

The addition of placeholders of photoresist, in addition to the normal photoresist features utilized for processing, may improve the verticality of sidewall edges of the normal photoresist features, as discussed above. Such addition of placeholders of photoresist may be utilized to form numerous types of vertical structures. FIGS. 23-27 describe an example embodiment in which the processing is utilized to form conductive runners.

Figure 23:
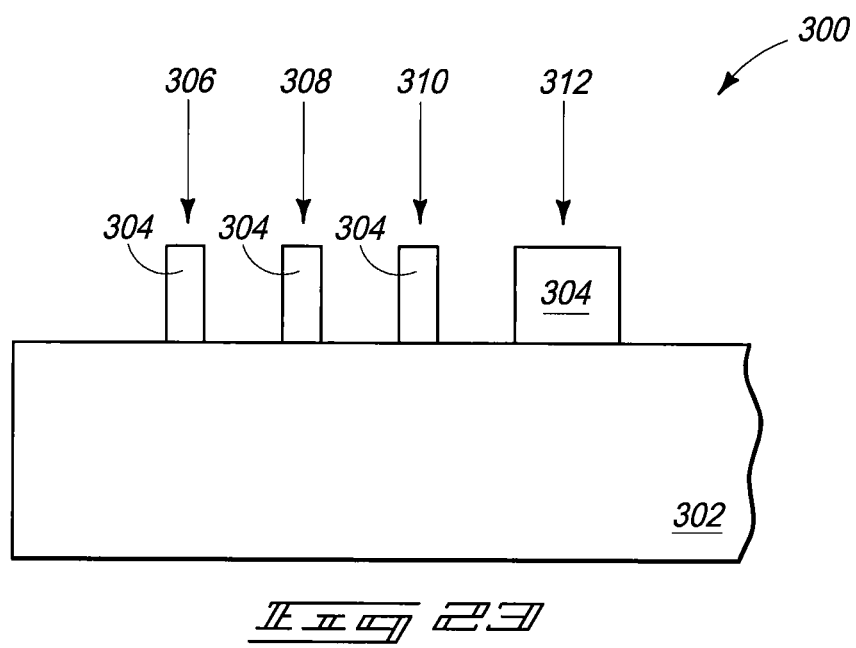
FIGS. 23-27 are diagrammatic, cross-sectional views of a portion of a semiconductor construction at various stages of an example embodiment method of forming electrically conductive runners across a semiconductor substrate.

Referring to FIG. 23, a construction 300 is shown to comprise a substrate 302, and patterned photoresist 304 over the substrate. The substrate 302 may be a semiconductor substrate, and may comprise various materials and layers associate with integrated circuitry, and/or integrated circuit fabrication.

The photoresist 304 is patterned into a plurality of features 306, 308, 310 and 312. The features 306, 308 and 310 are "normal" features that would conventionally be utilized to form the desired conductive runners. Feature 312 is an additional feature provided to improve photolithographic processing of features 306, 308 and 310; and serves no other function. Accordingly, feature 312 may be considered to be a "dummy" feature.

Figure 24:
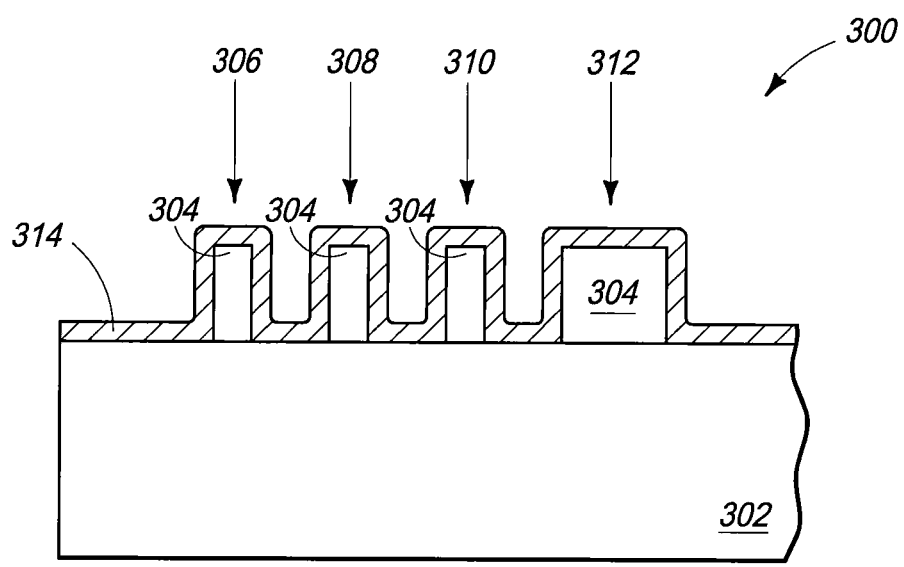

Referring to FIG. 24, conductive material 314 is formed across and between features 306, 308, 310 and 312. The conductive material 314 may comprise any suitable composition or combination of compositions; and may, for example, comprise, consist essentially of, or consist of one or more of various metals, metal-containing compositions, and conductively-doped semiconductor materials.

Figure 25:
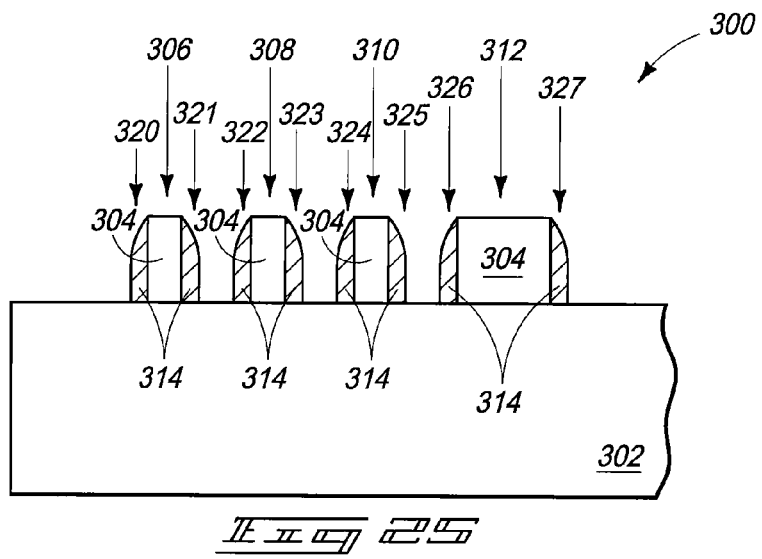

Referring to FIG. 25, conductive material 314 is anisotropically etched to form a plurality of substantially vertical structures 320-327. The vertical structures 320-325 are the desired structures, whereas the structures 326 and 327 that are adjacent dummy feature 312 are extra structures.

Figure 26:
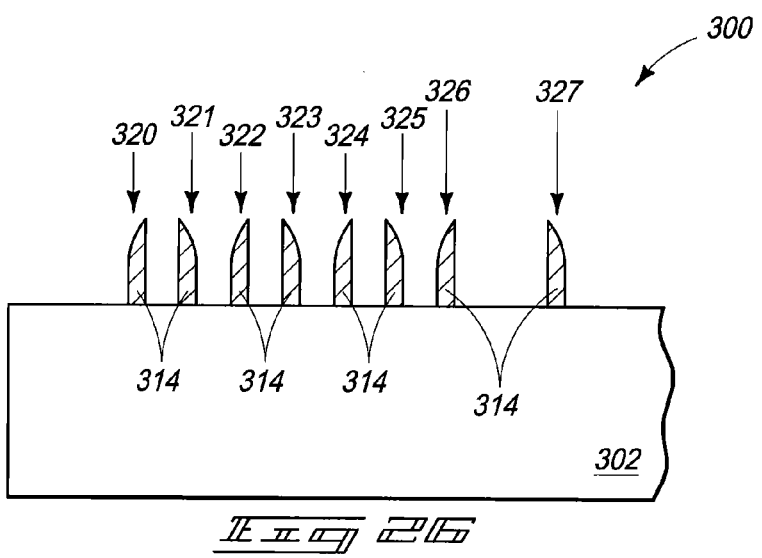

Referring to FIG. 26, photoresist 304 (FIG. 25) is removed.

Figure 27:
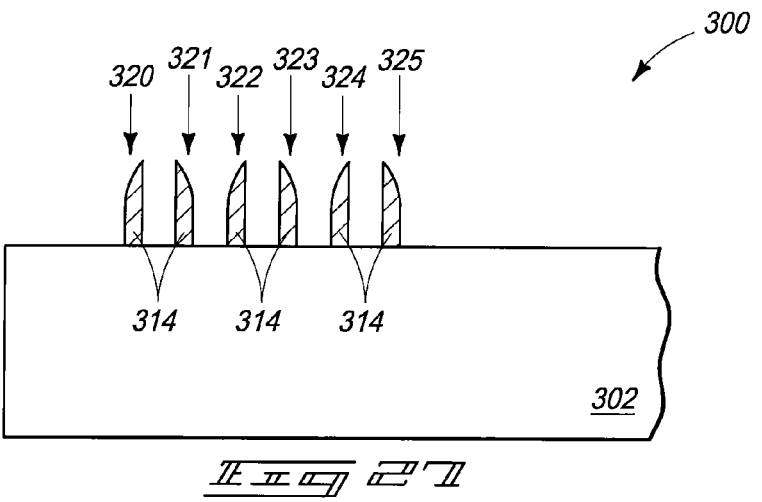

Referring to FIG. 27, the extra vertical structures 326 and 327 (FIG. 26) are removed. In some embodiments, the vertical structures 320-325 may be considered to be first vertical structures, and the extra vertical structures 226 and 327 may be considered to be second vertical structures which are treated (or used) differently from the first vertical structures. In the embodiment of FIG. 27, such different treatment comprises removal of the second vertical structures. However, in other embodiments the different treatment may comprise other processing. For instance, in the embodiment of FIG. 14, the formation of masks over some of the vertical structures may be considered a different treatment of such vertical structures relative to others of the vertical structures that were not covered by the masks.

The vertical structures remaining at the processing stage of FIG. 27 may correspond to electrically conductive runners that extend across a substrate 302 in and out of the page relative to the cross-sectional view of FIG. 27. Such conductive runners may be utilized as wiring for integrated circuitry.

The processing described herein may be utilized in any applications in which it is desired to form vertical sidewall edges of photoresist, including, for example, various semiconductor processing applications, and/or applications associated with fabrication of micro-electro-mechanical systems (MEMS).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a set of substantially vertical structures, comprising:
   photolithographically forming a plurality of substantially identical spaced-apart photoresist features over an underlying material; the spaced-apart photoresist features being in a series, and being of substantially uniform lateral width as one another;
   while forming the spaced-apart photoresist features, photolithographically forming a placeholder over the underlying material adjacent an end of said series; the placeholder being spaced from the end of the series of spaced-apart photoresist features by a gap, and having a lateral width that is no more than three-times the substantially uniform width of the spaced-apart photoresist features;

forming an overlying material over and between the spaced-apart photoresist features, over the placeholder, and within the gap between the placeholder and the end of the series of spaced-apart photoresist features;

anisotropically etching the overlying material into a plurality of first vertical structures along sidewalls of the spaced-apart photoresist features, and into a second vertical structure along a sidewall of the placeholder;

covering the second vertical structure with a mask while leaving the first vertical structures uncovered; and etching into the underlying material while using the mask and the first vertical structures to define a pattern that is to be transferred into the underlying material.

2. The method of claim 1 wherein the underlying material comprises a gate stack that is patterned with the mask and the first vertical structures.

3. The method of claim 2 wherein the gate stack is over a monocrystalline silicon wafer, and comprises, in ascending order from the wafer, tunnel dielectric material, charge-storage material, at least one electrically insulative material, and control gate material.

4. The method of claim 3 wherein the mask comprises photoresist.

5. The method of claim 1 wherein:
the series of substantially identical spaced-apart photoresist features has a pair of opposing ends;
the placeholder is a first placeholder adjacent one of said opposing ends;
a second placeholder is photolithographically formed adjacent another of said opposing ends while the first placeholder is formed;
the overlying material is formed over the second placeholder and within a gap between the second placeholder and the other of said opposing ends;
the anisotropic etching forms a third vertical structure along a sidewall of the second placeholder;
the mask covering the second vertical structure is a first mask, and a second mask is formed over the third vertical structure during the formation of the first mask; and
the etching into the underlying material utilizes the second mask to define a part of the pattern that is to be transferred into the underlying material.

6. A method of forming memory, comprising:
photolithographically forming a plurality of spaced-apart photoresist features over a stack of materials; the spaced-apart photoresist features being formed at a pitch, and having sidewalls;
while forming the spaced-apart photoresist features, photolithographically forming a placeholder over the stack adjacent an end of said plurality of spaced-apart photoresist features; the placeholder being spaced from said end by a gap;
forming an overlying material over and between the spaced-apart photoresist features, over the placeholder, and within said gap;
anisotropically etching the overlying material into a plurality of first spacers along the sidewalls of the spaced-apart photoresist features, and into a second spacer along a sidewall of the placeholder;
covering the second spacer with a mask while leaving the first spacers uncovered; and
etching into the stack while using the mask to define a location of a select gate, and while using the first spacers to define locations of string memory cells.

7. The method of claim 6 wherein the stack comprises tunnel dielectric material, charge-storage material, at least one electrically insulative material, and control gate material.

8. A method of forming memory, comprising:
photolithographically forming a plurality of spaced-apart photoresist features over a gate stack; the spaced-apart photoresist features being a series of features, and being of substantially uniform lateral width as one another;
while forming the spaced-apart photoresist features, photolithographically forming a placeholder over the gate stack adjacent an end of said series; the placeholder being spaced from the end of said series of spaced-apart photoresist features by a gap, and having a lateral width that is no more than three-times the substantially uniform width of the spaced-apart photoresist features;
forming a material over and between the spaced-apart photoresist features, over the placeholder, and within the gap between the placeholder and the end of the series of the spaced-apart photoresist features;
anisotropically etching the material into a plurality of first spacers along sidewalls of the spaced-apart photoresist features, and into a second spacer along a sidewall of the placeholder;
covering the second spacer with a mask while leaving the first spacers uncovered; and
etching into the gate stack while using the mask to define a location of a select gate, and while using the first spacers to define locations of memory cells.

9. The method of claim 8 wherein the spacers comprise electrically insulative material.

10. A method of forming memory, comprising:
photolithographically forming two series of spaced-apart photoresist features over a stack of materials; the two series being spaced from one another by an intervening region; one of the two series corresponding to a first series of the features, and another of the two series corresponding to a second series of the features;
while forming the spaced-apart photoresist features, photolithographically forming at least two separate placeholders over the stack and within the region between the first and second series of features; one of the placeholders being spaced from an end of the first series by a first gap and being a first placeholder; another of the placeholders being spaced from an end of the second series by a second gap and being a second placeholder;
forming an overlying material over and between the spaced-apart photoresist features of the first and second series, over the first and second placeholders, and within the first and second gaps;
anisotropically etching the overlying material into a plurality of first spacers along sidewalls of the spaced-apart photoresist features of the first series, into a plurality of second spacers along sidewalls of the spaced-apart photoresist features of the second series, into a third spacer along a sidewall of the first placeholder, and into a fourth spacer along a sidewall of the second placeholder;
covering the third spacer with a first mask, and covering the fourth spacer with a second mask; and
etching into the stack while using the first and second masks to define locations of select gates, and while using the first and second spacers to define locations of memory cells.

11. The method of claim 10 wherein the select gates are source select gates in a NAND array.

12. The method of claim 10 wherein the select gates are drain select gates in a NAND array.

\* \* \* \* \*